US012014957B2

(12) United States Patent
Lee et al.

(10) Patent No.: US 12,014,957 B2
(45) Date of Patent: Jun. 18, 2024

(54) SEMICONDUCTOR DEVICE HAVING A SOURCE/DRAIN CONTACT PLUG WITH AN UPWARDLY PROTRUDING PORTION

(71) Applicant: Samsung Electronics Co., Ltd., Suwon-si (KR)

(72) Inventors: Sungmoon Lee, Suwon-si (KR); Minchan Gwak, Hwaseong-si (KR); Heonjong Shin, Yongin-si (KR); Yongsik Jeong, Suwon-si (KR); Yeongchang Roh, Gwangju (KR); Doohyun Lee, Hwaseong-si (KR); Sunghun Jung, Suwon-si (KR); Sangwon Jee, Yongin-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 71 days.

(21) Appl. No.: 17/701,275

(22) Filed: Mar. 22, 2022

(65) Prior Publication Data
US 2022/0216107 A1 Jul. 7, 2022

Related U.S. Application Data

(63) Continuation of application No. 16/898,906, filed on Jun. 11, 2020, now Pat. No. 11,309,218.

(30) Foreign Application Priority Data
Sep. 17, 2019 (KR) .................. 10-2019-0114042

(51) Int. Cl.
*H01L 29/78* (2006.01)
*H01L 21/28* (2006.01)
(Continued)

(52) U.S. Cl.
CPC .. *H01L 21/76897* (2013.01); *H01L 21/28114* (2013.01); *H01L 21/28247* (2013.01);
(Continued)

(58) Field of Classification Search
CPC ..... H01L 21/823431; H01L 21/823821; H01L 21/845; H01L 27/0886; H01L 27/0924;
(Continued)

(56) References Cited

U.S. PATENT DOCUMENTS 8,969,199 B1  3/2015  Yuan et al.
9,899,321 B1  2/2018  Park et al.
(Continued)

*Primary Examiner* — Younes Boulghassoul
(74) *Attorney, Agent, or Firm* — Muir Patent Law, PLLC

(57) ABSTRACT

A method of manufacturing a semiconductor device includes forming an active region on a substrate, forming a gate structure on the substrate intersecting the active region, removing an upper portion of the gate structure and forming a gate capping layer, forming a preliminary contact plug electrically connected to a portion of the active region, the preliminary contact plug including first and second portions, forming a mask pattern layer including a first pattern layer covering an upper surface of the gate capping layer, and a second pattern layer extending from the first pattern layer to cover the second portion of the preliminary contact plug, and forming a contact plug using the mask pattern layer as an etch mask by recessing the first portion of the preliminary contact plug exposed by the mask pattern layer to a predetermined depth from an upper surface of the preliminary contact plug.

19 Claims, 20 Drawing Sheets

(51) Int. Cl.
- *H01L 21/308* (2006.01)
- *H01L 21/3213* (2006.01)
- *H01L 21/768* (2006.01)
- *H01L 21/8234* (2006.01)
- *H01L 23/528* (2006.01)
- *H01L 29/417* (2006.01)
- *H01L 29/423* (2006.01)
- *H01L 29/66* (2006.01)

(52) U.S. Cl.
CPC .... *H01L 21/3083* (2013.01); *H01L 21/32139* (2013.01); *H01L 21/76883* (2013.01); *H01L 21/76885* (2013.01); *H01L 21/76892* (2013.01); *H01L 21/823431* (2013.01); *H01L 21/823475* (2013.01); *H01L 23/5283* (2013.01); *H01L 29/41783* (2013.01); *H01L 29/41791* (2013.01); *H01L 29/42376* (2013.01); *H01L 29/66545* (2013.01); *H01L 29/66795* (2013.01); *H01L 29/785* (2013.01)

(58) Field of Classification Search
CPC ........... H01L 27/1211; H01L 27/10826; H01L 27/10879; H01L 29/41791; H01L 29/66795–66818; H01L 29/785–7856; H01L 2029/7857–7858; H01L 2924/13067; H01L 29/78696; H01L 29/42392; H01L 29/0673; H01L 29/66439; H01L 29/775; H01L 2029/7858; H01L 29/41775; H01L 29/41783; H01L 21/76877; H01L 21/76883; H01L 21/76897; H01L 21/76892; H01L 21/76816; H01L 29/41725–41791; H01L 29/456; H01L 29/485; H01L 21/76831; H01L 21/823475; H01L 21/823871; H01L 21/3213; H01L 21/32139; H01L 23/5283; H01L 23/5226

See application file for complete search history.

(56) References Cited

U.S. PATENT DOCUMENTS

| | | | |
|---|---|---|---|
| 10,170,377 | B1 | 1/2019 | Zang et al. |
| 10,170,583 | B2 | 1/2019 | Cheng et al. |
| 10,211,156 | B2 | 2/2019 | Yoon et al. |
| 10,347,744 | B1* | 7/2019 | Cheng ............... H01L 21/02252 |
| 2014/0205954 | A1 | 7/2014 | Lee |
| 2016/0126326 | A1* | 5/2016 | Park ..................... H01L 23/485 257/368 |
| 2016/0260669 | A1 | 9/2016 | Paak et al. |
| 2017/0092764 | A1 | 3/2017 | Xie et al. |
| 2017/0110549 | A1* | 4/2017 | Xie .................... H01L 21/76897 |
| 2018/0012839 | A1* | 1/2018 | Zang ................... H01L 23/5283 |
| 2018/0102364 | A1* | 4/2018 | Rastogi ............... H01L 29/4966 |
| 2018/0286956 | A1* | 10/2018 | Xie .................... H01L 21/76897 |
| 2018/0315822 | A1 | 11/2018 | Xie et al. |
| 2018/0350947 | A1 | 12/2018 | Liao et al. |
| 2019/0013241 | A1* | 1/2019 | Xie .................... H01L 21/28518 |
| 2019/0088742 | A1 | 3/2019 | Zang et al. |
| 2019/0131171 | A1* | 5/2019 | Gwak ................. H01L 29/6656 |
| 2019/0259667 | A1* | 8/2019 | Zang ..................... H01L 29/785 |
| 2019/0304902 | A1* | 10/2019 | Subramanian .... H01L 29/41791 |
| 2019/0393318 | A1 | 12/2019 | Chung et al. |
| 2020/0043787 | A1* | 2/2020 | Su ........................ H01L 23/535 |
| 2020/0075595 | A1 | 3/2020 | Shin et al. |
| 2020/0075738 | A1* | 3/2020 | Zang ..................... H01L 29/785 |
| 2020/0176309 | A1* | 6/2020 | Chen ................... H01L 23/5226 |
| 2020/0176324 | A1* | 6/2020 | Zang .................. H01L 29/41791 |
| 2020/0365698 | A1* | 11/2020 | Tsai .................. H01L 21/76849 |
| 2021/0066453 | A1 | 3/2021 | Lee et al. |

\* cited by examiner

SEMICONDUCTOR DEVICE HAVING A SOURCE/DRAIN CONTACT PLUG WITH AN UPWARDLY PROTRUDING PORTION

CROSS-REFERENCE TO RELATED APPLICATION(S)

This application is a continuation of U.S. application Ser. No. 16/898,906 filed on Jun. 11, 2020, which claims priority under 35 USC 119(a) to Korean Patent Application No. 10-2019-0114042 filed on Sep. 17, 2019 in the Korean Intellectual Property Office, the entire disclosure of each of which is incorporated herein by reference for all purposes.

BACKGROUND

The present inventive concept relates to a semiconductor device and a method of manufacturing the same.

To meet the demand for high performance, semiconductor devices operate in high speed and with multifunction, and the degree of integration of the semiconductor devices increases. Such high integration trend of the semiconductor devices may include constituent elements such as gate electrodes or wires with fine patterns or spaced apart from each other by a fine separation distance. In addition, to avoid the limitation of operating characteristics due to a decrease in the size of a planar metal oxide semiconductor field effect transistor (MOSFET) in the high integration trend, efforts have been made to develop semiconductor devices having a channel having a three-dimensional structure.

SUMMARY

An aspect of the present inventive concept is to provide a method of manufacturing a semiconductor device having improved reliability and productivity, and a semiconductor device manufactured thereby.

According to an exemplary embodiment of the present inventive concept, a method of manufacturing a semiconductor device includes forming active regions extending in a first direction on a substrate, forming, on the substrate, sacrificial gate structures extending in a second direction to intersect the active regions, forming source/drain regions on the active regions, on opposite sides of each of the sacrificial gate structures, forming a first interlayer insulating layer covering the source/drain regions and the sacrificial gate structures, removing the sacrificial gate structures and forming gate structures where the sacrificial gate structures have been removed, removing upper portions of the gate structures and forming gate capping layers where the upper portions of the gate structures have been removed, forming a preliminary contact plug penetrating through the first interlayer insulating layer to be connected to a corresponding one of the source/drain regions, forming a mask pattern layer exposing a first portion of the preliminary contact plug and covering a second portion of the preliminary contact plug and at least a portion of an upper surface of each of the gate capping layers, forming a contact plug using the mask pattern layer as an etch mask by recessing the first portion of the preliminary contact plug exposed by the mask pattern layer to form a recessed region, wherein the contact plug includes a first portion and a second portion extending upwardly from the first portion, and forming a contact insulating layer filling the recessed region.

According to an exemplary embodiment of the present inventive concept, a method of manufacturing a semiconductor device includes forming an active region extending in a first direction on a substrate, forming a gate structure on the substrate, the gate structure extending in a second direction to intersect the active region, removing an upper portion of the gate structure and forming a gate capping layer where the upper portion of the gate structure is removed, forming a preliminary contact plug electrically connected to a portion of the active region, the preliminary contact plug including a first portion and a second portion, forming a mask pattern layer, the mask pattern layer including a first pattern layer covering an upper surface of the gate capping layer and extending in the second direction, and a second pattern layer extending from the first pattern layer in the first direction, to cover the second portion of the preliminary contact plug, and forming a contact plug using the mask pattern layer as an etch mask by recessing the first portion of the preliminary contact plug exposed by the mask pattern layer to a predetermined depth from an upper surface of the preliminary contact plug.

According to an exemplary embodiment of the present inventive concept, a method of manufacturing a semiconductor device includes forming active regions extending in a first direction on a substrate, forming, on the substrate, sacrificial gate structures extending in a second direction to intersect the active regions, forming source/drain regions on the active regions on opposite sides of each of the sacrificial gate structures, removing the sacrificial gate structures and forming gate structures where the sacrificial gate structures are removed, removing upper portions of the gate structures and forming gate capping layers where the gate structures are removed, forming a preliminary contact plug extending to be connected to a corresponding one of the source/drain regions, forming a mask pattern layer having a mesh form on the preliminary contact plug and the gate capping layers, exposing a portion of the preliminary contact plug, and forming a contact plug using the mask pattern layer as an etch mask by recessing the portion of the preliminary contact plug exposed by the mask pattern layer to form a recessed region. The contact plug includes a first portion and a second portion extending upwardly from the first portion.

According to an exemplary embodiment of the present inventive concept, a semiconductor device includes active regions extending in a first direction on a substrate, gate structures extending in a second direction to intersect the active regions, on the substrate, gate capping layers disposed on the gate structures, source/drain regions disposed on the active regions on at least one side of the gate structures, and contact plugs vertically extending on the substrate, to be connected to the source/drain regions, the contact plugs having a first region and a second region protruding upwardly from the first region. The gate capping layers have a shape in which edges of the gate capping layers in the first direction are partially removed from upper portions, in areas not adjacent to the second region of the contact plugs.

BRIEF DESCRIPTION OF DRAWINGS

The above and other aspects, features, and advantages of the present inventive concept will be more clearly understood from the following detailed description, taken in conjunction with the accompanying drawings, in which.

DETAILED DESCRIPTION

Hereinafter, example embodiments will be described with reference to the accompanying drawings.

Figure 1:
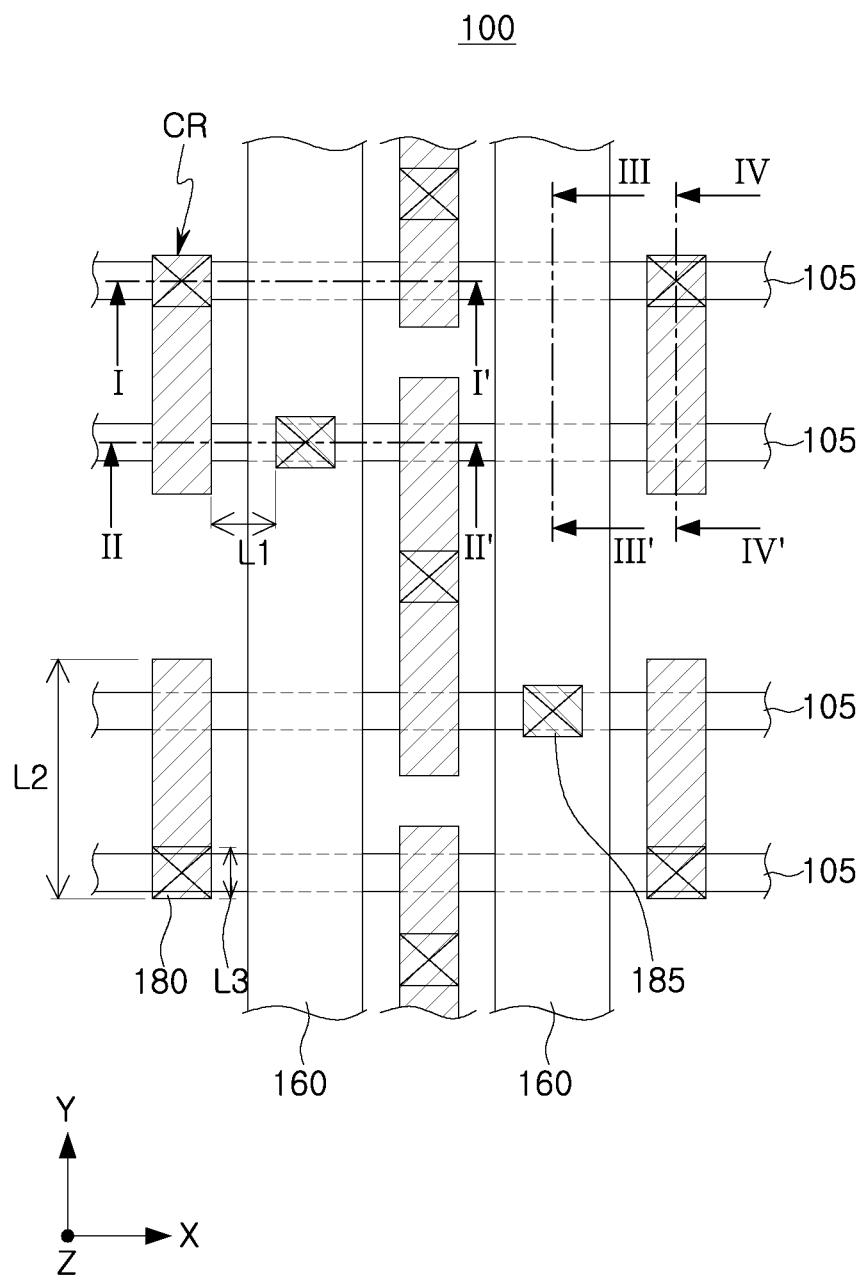
FIG. 1 is a layout diagram illustrating a semiconductor device according to example embodiments.

FIG. 1 is a layout diagram illustrating a semiconductor device according to example embodiments.

Figure 2A:
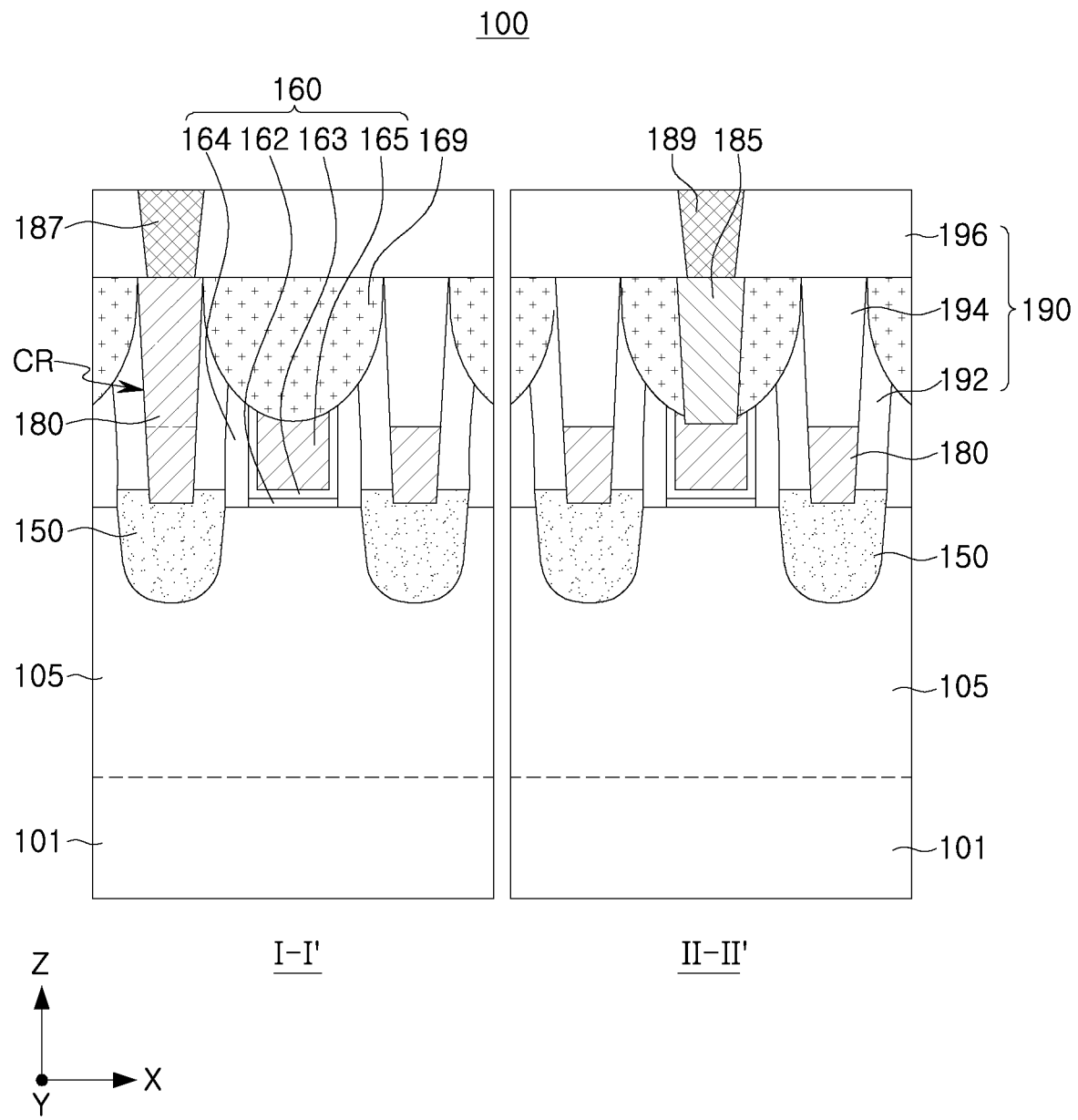
FIGS. 2A and 2B are cross-sectional views illustrating semiconductor devices according to example embodiments.
Figure 2B:
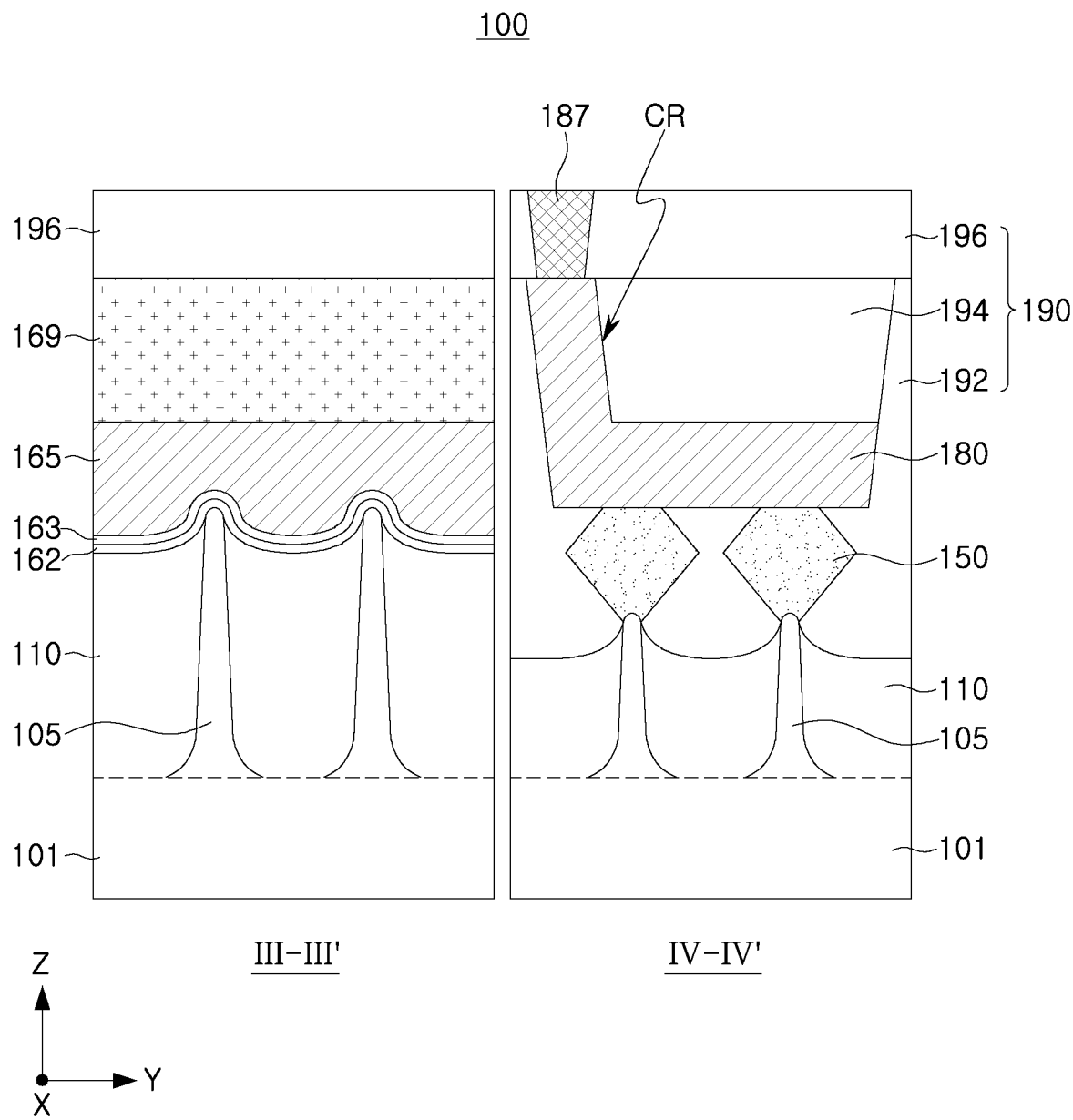

FIGS. 2A and 2B are cross-sectional views illustrating a semiconductor device according to example embodiments. FIGS. 2A and 2B illustrate cross sections of the semiconductor device, taken along lines I-I', II-II', III-III' and IV-IV' in FIG. 1. For convenience of description, only a layout of major components of the semiconductor device is illustrated in FIG. 1.

Referring to FIGS. 1 to 2B, a semiconductor device 100 may include a substrate 101, active fins 105 on the substrate 101, gate structures 160 extending to intersect the active fins 105, and gate capping layers 169 disposed on the gate structures 160, source/drain regions 150 disposed on the active fins 105 on at least one side of the gate structures 160, and contact plugs 180 connected to the source/drain regions 150. The semiconductor device 100 may further include a device isolation layer 110 between the active fins 105, gate contact plugs 185 connected to the gate structures 160, an interlayer insulating layer 190, and first and second vias 187 and 189 connected to the contact plugs 180 and the gate contact plugs 185, respectively. The gate structure 160 may include first and second gate dielectric layers 162 and 163, gate spacer layers 164, and a gate electrode 165. The semiconductor device 100 may include fin field-effect transistors (FinFET) devices in which each of the active fins 105 has a fin structure. In an example embodiment, the FinFET devices may include the gate structures 160 intersecting the active fins 105.

The substrate 101 may have an upper surface extending in an X direction and a Y direction. The substrate 101 may include a semiconductor material, such as a group IV semiconductor, a group III-V compound semiconductor, or a group II-VI compound semiconductor. For example, the group IV semiconductor may include silicon, germanium or silicon-germanium. The substrate 101 may be provided as a bulk wafer, an epitaxial layer, a silicon-on-insulator (SOI) layer, a semiconductor-on-insulator (SeOI) layer, or the like.

The active fins 105 may be defined by the device isolation layer 110 in the substrate 101, and may be disposed to extend in a first direction, for example, the X direction. The active fins 105 form an active region and may have a structure protruding from the substrate 101. The active fins 105 may be disposed in such a manner that upper ends of the active fins 105 protrude upwardly from an upper surface of the device isolation layer 110 to a predetermined height. The active fins 105 may be formed of a portion of the substrate 101 or may include an epitaxial layer grown from the substrate 101. The active fins 105 on the substrate 101 may be partially recessed on opposite sides of the gate structures 160, and source/drain regions 150 may be disposed on the recessed active fins 105. Thus, as illustrated in FIG. 2B, the active fins 105 below the gate structures 160 may have a relatively high height. According to example embodiments, the active fins 105 may include impurities, and at least portions of the active fins 105 may include impurities of different conductivity types, but are not limited thereto.

The device isolation layer 110 may define the active fins 105 in the substrate 101. The device isolation layer 110 may be formed by, for example, a shallow trench isolation (STI) process. The device isolation layer 110 may partially expose upper sidewalls of the active fins 105. According to example embodiments, the device isolation layer 110 may include a region extending deeper into a lower portion of the substrate 101, between the active fins 105. The device isolation layer 110 may have a curved upper surface having a relatively higher level as it is closer to the active fins 105, but the shape of the upper surface of the device isolation layer 110 is not limited thereto. The device isolation layer 110 may be formed of an insulating material. The device isolation layer 110 may be formed of, for example, oxide, nitride, or a combination thereof. As illustrated in FIG. 2B, the device isolation layer 110 may have different heights of upper surfaces on a lower portion and the outside of the gate structures 160. The present invention, however, is not limited thereto. In an example embodiment, the height difference of the upper surfaces of the device isolation layer 110 may be variously changed according to manufacturing processes.

The source/drain regions 150 may be disposed on recessed regions in which the active fins 105 are recessed, respectively, on opposite sides of the gate structures 160. The source/drain regions 150 may be provided as a source region or a drain region of a transistor. Upper surfaces of the source/drain regions 150 may be located at a height that is similar to or higher than that of the bottom surface of the gate structures 160, as illustrated in FIG. 2A. However, relative heights of the source/drain regions 150 and the gate structures 160 may be variously changed according to example embodiments. For example, the source/drain regions 150 may also have an elevated source/drain shape of which a top surface is higher than the bottom surfaces of the gate structures 160, for example, the gate electrodes 165.

The source/drain regions 150 may have a pentagonal, hexagonal, or similar shape in a cross section in the Y direction, as illustrated in FIG. 2B, on opposite sides of the gate structures 160. However, in example embodiments, the source/drain regions 150 may have various shapes, for example, may have a shape of any one of a polygon, a circle, an oval, and a rectangle. The source/drain regions 150 may have a substantially flat top surface in a cross section in the X direction, as illustrated in FIG. 2A, and may have a curved lower portion such as a portion of a circular shape, an oval shape or a similar shape. However, such a shape may be variously changed in example embodiments according to a distance between adjacent gate structures 160, the height of the active fins 105, and the like. The term "substantially" may be used herein to emphasize this meaning, unless the context or other statements indicate otherwise. For example, items described as "substantially flat," or "substantially coplanar," may be exactly flat, or coplanar, or may be flat, or coplanar within acceptable variations that may occur, for example, due to manufacturing processes.

The source/drain regions 150 may be formed of a semiconductor material. For example, the source/drain regions 150 may include at least one of silicon germanium (SiGe), silicon (Si), silicon arsenic (SiAs), silicon phosphide (SiP), and silicon carbide (SiC). For example, the source/drain regions 150 may be formed of an epitaxial layer. For example, the source/drain regions 150 may include n-type doped silicon (Si) and/or p-type doped silicon germanium (SiGe). In example embodiments, the source/drain regions 150 may include a plurality of regions including different concentrations of elements and/or different dopants. Further, in example embodiments, the source/drain regions 150 may be connected to or merged with each other on two or more active fins 105 adjacent to each other, thereby forming one source/drain region 150.

The gate structures 160 may be disposed to extend in one direction, for example, the Y direction, to intersect the active fins 105, on top of the active fins 105. Channel regions of transistors may be formed in the active fins 105 that intersect the gate structures 160. As used herein, "channel region" refers to a region that includes a depletion region of a transistor, and refers to the region of the active fin 105 that intersects the gate structure 160 and is adjacent to the gate structure 160. Each gate structure 160 may include the first and second gate dielectric layers 162 and 163, gate spacer layers 164, and a gate electrode 165.

The first and second gate dielectric layers 162 and 163 may be disposed between the active fins 105 and the gate electrodes 165, and below the bottom surface of the gate electrodes 165, the first gate dielectric layer 162 may be disposed on the bottom surface of the second gate dielectric layer 163. The second gate dielectric layer 163 may be disposed to cover the bottom surface and opposite sides of the gate electrodes 165. In example embodiments, either one of the first and second gate dielectric layers 162 and 163 may be omitted. The first and second gate dielectric layers 162 and 163 may include oxide, nitride, or a high-k dielectric material. The high-k material may indicate a dielectric material having a dielectric constant higher than that of silicon oxide ($SiO_2$). The high-k material may be, for example, any one of aluminum oxide ($Al_2O_3$), tantalum oxide ($Ta_2O_3$), titanium oxide ($TiO_2$), yttrium oxide ($Y_2O_3$), zirconium oxide ($ZrO_2$), zirconium silicon oxide ($ZrSi_xO_y$), hafnium oxide ($HfO_2$), hafnium silicon oxide ($HfSi_xO_y$), lanthanum oxide ($La_2O_3$), lanthanum aluminum oxide ($LaAl_xO_y$), lanthanum hafnium oxide ($LaHf_xO_y$), hafnium aluminum oxide ($HfAl_xO_y$), or praseodymium oxide ($Pr_2O_3$).

The gate electrodes 165 may include a conductive material, for example, metal nitride such as titanium nitride (TiN), tantalum nitride (TaN), or tungsten nitride (WN), and/or metal such as aluminum (Al) or tungsten (W) or molybdenum (Mo), or a semiconductor material such as doped polysilicon. The gate electrodes 165 may also be comprised of two or more multilayers. According to example embodiments, the gate electrodes 165 may be disposed separately from each other in the Y direction, between at least some adjacent transistors, depending on the configuration of the semiconductor device 100.

The gate spacer layers 164 may be disposed on opposite sides of the gate electrode 165. The gate spacer layers 164 may insulate the source/drain regions 150 from the gate electrodes 165. The gate spacer layers 164 may be formed in a multilayer structure according to example embodiments. The gate spacer layers 164 may be formed of oxide, nitride, and oxynitride, and for example, may be formed of a low dielectric constant film.

The gate capping layers 169 may be disposed on upper surfaces of the gate structures 160. In an example embodiment, the upper surfaces of the gate structures 160 may be curved. Accordingly, the gate capping layers 169 may have a lower surface of a curved surface that is convex downwardly and a substantially flat upper surface. In an example embodiment, each of the gate capping layers 169 may include an upper portion that is in contact with a contact region CR of the contact plug 180 and a contact insulating layer 194 spaced apart from each other in the X direction. The top surface of the gate capping layer 169 may have a width greater than that of the gate structure 160 in the X direction, and may have a maximum width that fills between adjacent contact plugs 180. The lower surface of the gate capping layer 169 may be in contact with the second gate dielectric layer 163, the gate spacer layers 164, the gate electrode 165, and a first interlayer insulating layer 192. The present invention is not limited thereto. In some embodiments, the gate capping layers 169 may be disposed to be limited to upper portions of the gate spacer layers 164 without extending to the outside of the gate spacer layers 164, and may be confined between the gate spacer layers 164 to be covered by both sides of the gate spacer layers 164 in the X direction. The term "contact," as used herein, refers to a direction connection (i.e., touching) unless the context indicates otherwise.

The gate capping layers 169 may include at least one of SiO, SiN, SiCN, SiOC, SiON and SiOCN. According to example embodiments, the gate capping layers 169 may include a material different from that of the first interlayer insulating layer 192. The gate capping layers 169 may allow contact holes for formation of the contact plugs 180 to be self-aligned, between the gate capping layers 169, when the contact holes are formed.

The contact plugs 180 may be connected to the source/drain regions 150 to apply an electrical signal to the source/drain regions 150. The contact plugs 180 may extend from the top to the bottom while penetrating through the first interlayer insulating layer 192. The contact plugs 180 may be disposed on the source/drain regions 150, and in some embodiments, may extend in the Y direction to have a longer length than that of the source/drain regions 150. Each of the contact plugs 180 may have an inclined side surface and may have a downwardly decreasing width (i.e., a width of a lower portion of the contact plug 180 is less than a width of an upper portion of the contact plug 180) depending on an aspect ratio of the contact holes, but an example embodiment thereof is not limited thereto. In an example embodiment, lower end portions of the contact plugs 180 may be buried in the source/drain regions 150 to a predetermined depth. In some embodiments, the contact plugs 180 may also be disposed to contact along the top surface of the source/drain regions 150 without recessing the source/drain regions 150.

Each of the contact plugs 180 may include a first portion 180-1 and a second portion 180-2 extending upwardly from the first portion 180-1. (See, FIGS. 3A and 3B). The second portion 180-2 may be disposed in the contact region CR penetrating the first interlayer insulating layer 192. As illustrated in FIG. 1, for example, when the gate contact plugs 185 as well as the contact plugs 180 are located on top of the active fins 105 to overlap the active fins 105, each of the contact plugs 180 may include the second portion 180-2 disposed in the contact regions CR and extending upwardly from the first portion 180-1 without contacting the gate contact plugs 185 spaced apart from the contact plugs 180 in the X direction. The first portions 180-1 of the contact plugs 180 may be disposed in lower portions of recessed regions other than the contact regions CR, and the recessed regions may be filled with the contact insulating layer 194. The contact regions CR may not be disposed side by side, in the X direction, with the gate contact plugs 185. The contact regions CR may be disposed side by side, in the X direction, with the contact insulating layer 194 on the first portions 180-1 of the contact plugs 180. Due to the structure of the contact plugs 180 and the gate contact plugs 185 which are not disposed side by side in their upper portions where they have relatively wide areas, even when a distance L1 between the contact plugs 180 and the gate contact plugs 185 is relatively close, the contact plugs 180 and the gate contact plugs 185 may be electrically separated from each other stably.

The contact region CR may have a length L3 less than a length L2 of one contact plug 180 in the Y direction. The length L3 of the contact region CR may be less than a length of the recessed region, which is a region that does not overlap the contact region CR in a plan view. The length L3 of the contact region CR may be in the range of, for example, about 10 nm to about 40 nm. The length L3 of the contact region CR may be variously changed in example embodiments, and may be determined in a range in which the contact region CR is not disposed side by side with the gate contact plugs 185 adjacent thereto. The shape of the contact plug 180 will be described in more detail with reference to FIGS. 3A and 3B below. Terms such as "about" may reflect amounts, sizes, orientations, or layouts that vary only in a small relative manner, and/or in a way that does not significantly alter the operation, functionality, or structure of certain elements. For example, a range from "about 0.1 to about 1" may encompass a range such as a 0%-5% deviation around 0.1 and a 0% to 5% deviation around 1, especially if such deviation maintains the same effect as the listed range.

The gate contact plugs 185 may be connected to the gate structures 160 and penetrate through the gate capping layers 169, and may apply an electrical signal to the gate electrodes 165. The gate contact plugs 185 may include lower ends buried in the gate electrodes 165 to a predetermined depth, but an example embodiment thereof is not limited thereto. Heights of lower surfaces of the gate contact plugs 185 may be similar to or higher than heights of upper surfaces of the recessed regions of the contact plugs 180, but are not limited thereto. The contact plugs 180 and the gate contact plugs 185 may include a conductive material, for example, metal such as tungsten (W), aluminum (Al), copper (Cu) or the like, or a semiconductor material such as doped polysilicon.

The interlayer insulating layer 190 may include the first interlayer insulating layer 192 covering top surfaces of the source/drain regions 150, the gate structures 160 and the device isolation layer 110, the contact insulating layer 194 filling the recess regions of the contact plugs 180, and a second interlayer insulating layer 196 on the contact plugs 180. The contact insulating layer 194 may have a top surface substantially coplanar with top surfaces of the contact plugs 180. According to example embodiments, the contact insulating layer 194 may also have a top surface that is substantially coplanar with the top surfaces of the gate contact plugs 185. In some embodiments, the contact insulating layer 194 and the second interlayer insulating layer 196 may be formed of a single layer. The interlayer insulating layer 190 may include, for example, at least one of oxide, nitride, and an oxynitride. In an example embodiment, the interlayer insulating layer 190 may include a low dielectric constant material.

The first and second vias 187 and 189 may penetrate through the second interlayer insulating layer 196 and be connected to the contact plugs 180 and the gate contact plugs 185, respectively. The first and second vias 187 and 189 may include a conductive material, for example, metal such as tungsten (W), aluminum (Al), copper (Cu) or the like, or a semiconductor material such as doped polysilicon. Although not illustrated, wiring structures such as metal lines connected to the first and second vias 187 and 189 may be further disposed on the first and second vias 187 and 189. However, according to some embodiments, the first and second vias 187 and 189 may be integrated with the contact plugs 180 and the gate contact plugs 185, respectively.

Figure 3A:
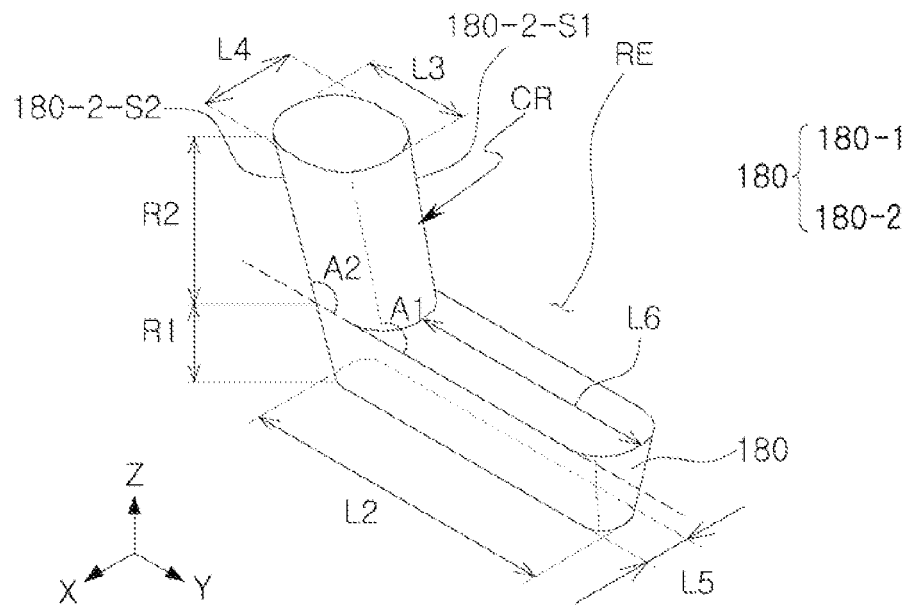
FIGS. 3A and 3B are perspective views illustrating a portion of components of a semiconductor device according to example embodiments.
Figure 3B:
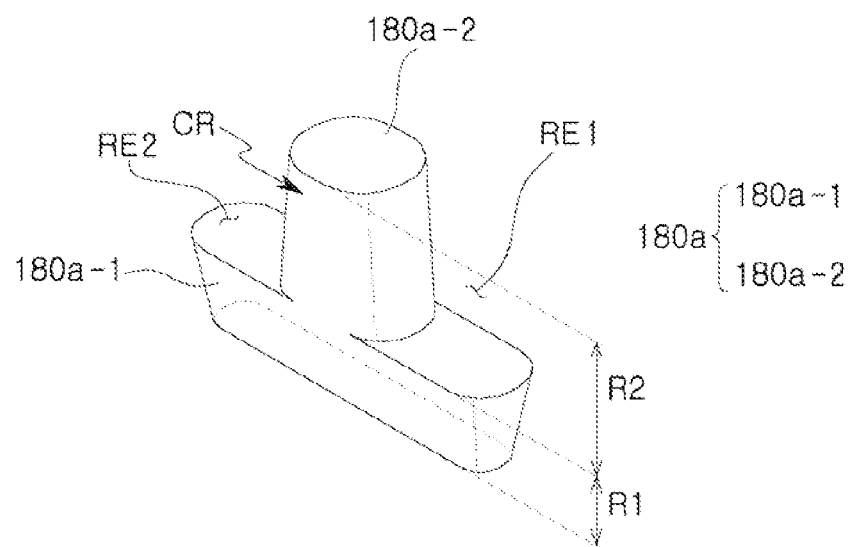

FIGS. 3A and 3B are perspective views illustrating a portion of components of a semiconductor device according to example embodiments. FIGS. 3A and 3B illustrate contact plugs 180 and 180a, respectively.

Referring to FIG. 3A, the contact plug 180 may include the first portion 180-1 disposed in a first region R1 that is a lower region, and the second portion 180-2 disposed in a second region R2. The second portion 180-2 may protrude upwardly from one end of the first portion 180-1. Relative heights of the first portion 180-1 and the second portion 180-2 may vary in various embodiments. The first region R1 (or the first portion 180-1) may be located on one end of the second region R2 (or the second portion 180-2).

The second region R2 may correspond to the contact region CR described above with reference to FIGS. 1 to 2B, and may be connected to the first via 187 (see FIG. 2A) thereon or a wiring line. The second portion 180-2 of the contact plug 180 remains after a preliminary contact plug being recessed. In the second region R2, a first side surface 180-2-S1 of the second portion 180-2 may form a sidewall of a recessed region RE, and a second side surface 180-2-S2, opposite the first side surface, of the second portion 180-2 may form an outer sidewall of the contact plug 180, which does not face the recessed region RE. The first side surface 180-2-S1 and the second side surface 180-2-S1 may have negative slopes at first and second obtuse angles A1 and A2 with respect to an upper surface of the first portion 180-1, respectively. The first and second obtuse angles A1 and A2 may be the same or different. The side surface of the second region R2 facing the recessed region RE is illustrated in a convex shape toward the recessed region RE, but the shape thereof is not limited thereto and may be variously changed according to example embodiments. For example, in some embodiments, the side surface of the second region R2 facing the recessed region RE may be a substantially flat surface or may have a concave shape toward the recessed region RE.

As described above, in the extension direction of the contact plug 180, the length L3 of the second region R2 may be less than the length L2 of the first region R1 and a length L6 of the recessed region RE. The contact plug 180 may have inclined side surfaces, to have the width reduced toward the lower surface thereof, by the aspect ratio. Accordingly, a length L4 of an upper surface of the second region R2 in a direction perpendicular to the extension direction may be greater than a length L5 of the lower surface of the first region R1.

Referring to FIG. 3B, the contact plug 180a may have a shape in which a second portion 180a-2 is not disposed on one end of a first portion 180a-1 and is disposed on a position spaced apart from opposite ends of the first portion 180a-1. The first portion 180a-1 may be disposed in a first region R1, and the second portion 180a-2 may be disposed in a second region R2. Accordingly, first and second recessed regions RE1 and RE2 may be formed on opposite sides of the second portion 180a-2. As described above, in example embodiments, relative positions of the first portion 180a-1 and the second portion 180a-2 may be variously changed. In this example embodiment, a first side surface of the second portion 180a-2 may form a sidewall of the first recessed region RE1, and a second side surface of the second portion 180a-2 may form a sidewall of the second recessed region RE2 spaced apart from the first recessed region RE1 in a second direction, for example, Y direction. The first side surface of the second portion 180a-2 may have a positive slope, and the second side surface thereof may have a negative slope.

Figure 4A:
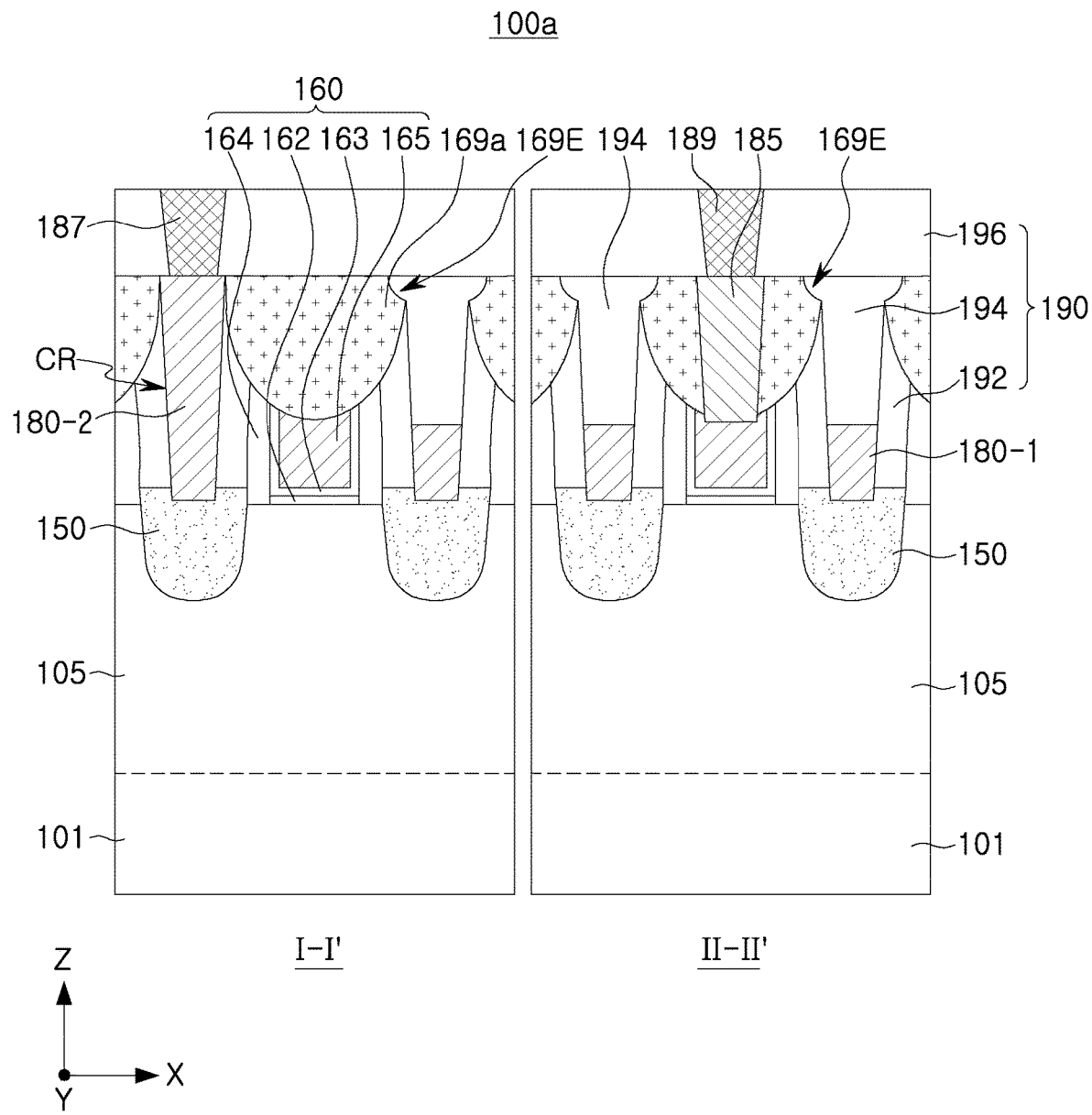
FIGS. 4A and 4B are cross-sectional views illustrating semiconductor devices according to example embodiments.
Figure 4B:
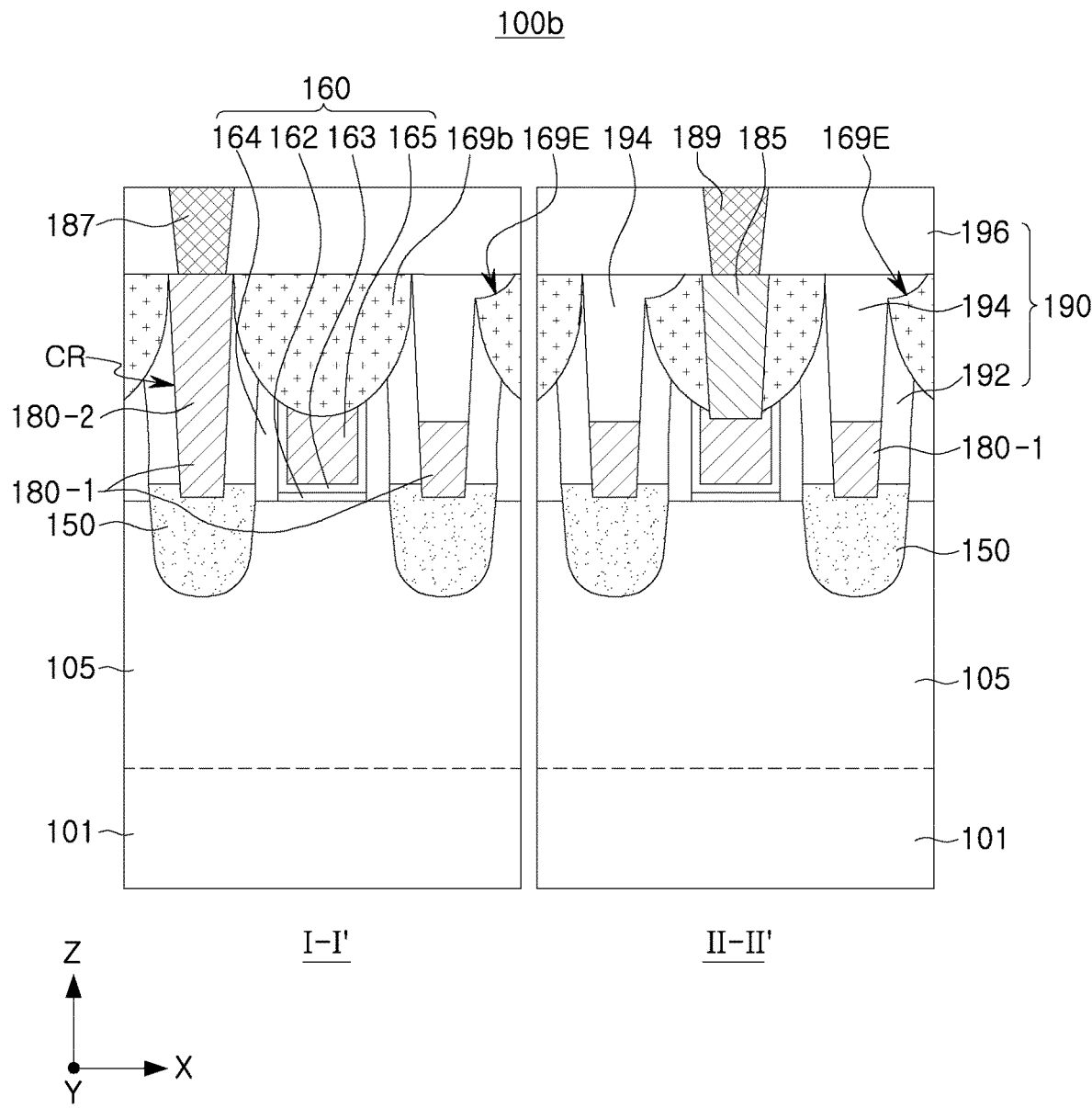

FIGS. 4A and 4B are cross-sectional views illustrating semiconductor devices according to example embodiments. FIGS. 4A and 4B illustrate cross sections corresponding to FIG. 2A.

Referring to FIG. 4A, in a semiconductor device 100a, gate capping layers 169a may be partially removed from the top surface, to have a recessed edge 169E having a recessed shape. For example, the gate capping layers 169a may have the recessed edge 169E which is in contact with a contact insulating layer 194. On the other hand, the gate capping layer 169a may have an edge which is not recessed and is contact with the second portion 180-2 of the contact plug 180.

The recessed edge 169E of the gate capping layers 169a may have a shape recessed from an upper surface to a lower side, and a detailed shape thereof is not limited to that illustrated in the drawing. The gate capping layer 169a may have a portion removed on the recessed edge 169E, while having a substantially flat top surface. The recessed edge 169E of the gate capping layer 169a may be in contact with the contact insulating layer 194. The shape of the gate capping layers 169a may be formed by a shape of a mask pattern layer MA described below with reference to FIGS. 14A to 14C.

Referring to FIG. 4B, in a semiconductor device 100b, gate capping layers 169b may have a recessed edge 169E, and unlike the example embodiment of FIG. 4A, may have an asymmetrical shape in the X direction.

The gate capping layers 169b may have an unrecessed edge that extends flatly from the top surface on one end in the X direction, and may have a recessed edge 169E having a recessed shape on the other end. Such a structure may be formed depending on the arrangement of the mask pattern layer MA and the gate capping layers 169b described below with reference to FIGS. 14A to 14C. Thus, in some embodiments, the gate capping layers 169b may also be configured to have recessed edges 169E having a shape in which opposite ends of the gate capping layers in the X direction are recessed edges and recessed depths or widths are different from each other.

Figure 5:
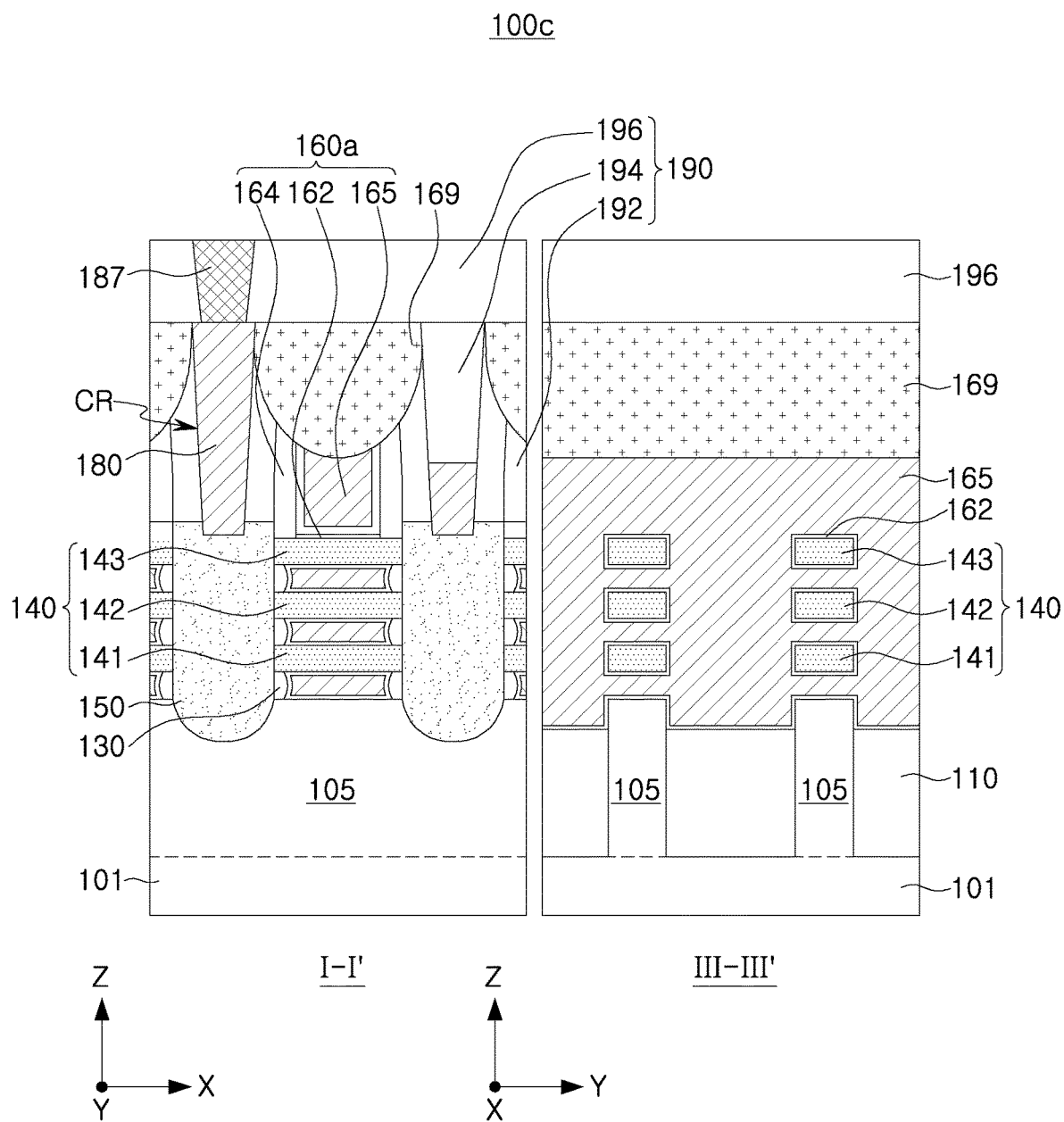
FIG. 5 is a cross-sectional view illustrating a semiconductor device according to example embodiments.

FIG. 5 is a cross-sectional view illustrating a semiconductor device according to example embodiments. FIG. 5 illustrates cross sections corresponding to lines I-I' and III-III' of FIG. 1.

Referring to FIG. 5, a semiconductor device 100c may include a substrate 101, an active fin 105 on the substrate 101, channel structures 140 including a plurality of channel layers 141, 142 and 143 vertically spaced apart from each other on the active fin 105, source/drain regions 150 in contact with the plurality of channel layers 141, 142 and 143, gate structures 160a extending to intersect the active fin 105, gate capping layers 169 disposed on the gate structures 160a, and contact plugs 180 connected to the source/drain regions 150. The semiconductor device 100c may further include a device isolation layer 110, internal spacer layers 130, an interlayer insulating layer 190, and a via 187. The gate structure 160a may include a gate dielectric layer 162, gate spacer layers 164, and a gate electrode 165.

In the semiconductor device 100c, the active fin 105 has a fin structure, and the gate electrode 165 is disposed between the active fin 105 and the channel structure 140 and between the plurality of channel layers 141, 142 and 143 of the channel structures 140. Accordingly, the semiconductor device 100c may include a multi bridge channel FET (MBCFET™) device configured by the channel structures 140, the source/drain regions 150, and the gate structures 160a. Hereinafter, the same reference numerals as those in FIGS. 1 to 2B indicate corresponding configurations, and descriptions of the above description will be omitted.

The channel structures 140 may include first to third channel layers 141, 142 and 143, which are two or more channel layers, as a plurality of channel layers spaced apart from each other in a direction perpendicular to the top surfaces of the active fins 105, for example, the Z direction, on the active fins 105. The channel structures 140 may form an active region together with the active fins 105. The first to third channel layers 141, 142 and 143 may be connected to the source/drain regions 150 and may be spaced apart from the top surfaces of the active fins 105. The first to third channel layers 141, 142 and 143 may have the same or similar width as that of the active fins 105 in the Y direction, and may have the same or similar width to that of the gate structures 160a in the X direction. However, according to some embodiments, the first to third channel layers 141, 142 and 143 may have a reduced width such that side surfaces are disposed below the gate structures 160a in the X direction.

The first to third channel layers 141, 142 and 143 may be formed of a semiconductor material, and may include, for example, at least one of silicon (Si), silicon germanium (SiGe), and germanium (Ge). The first to third channel layers 141, 142 and 143 may be formed of the same material as the substrate 101, for example. The number and shape of the channel layers 141, 142 and 143 constituting one channel structure 140 may vary in various embodiments.

The gate structures 160a may be disposed to extend in one direction, for example, the Y direction while being intersected with the active fins 105 and the channel structures 140, on the top of the active fins 105 and the channel structures 140. Channel regions of transistors may be formed in the active fins 105 and the channel structures 140 that intersect the gate structure 160a. The gate structure 160a includes the gate electrode 165, the gate dielectric layer 162 between the gate electrode 165 and the plurality of channel layers 141, 142 and 143, and the gate spacer layers 164 on sides of the gate electrode 165.

The gate dielectric layer 162 may be disposed between the active fin 105 and the gate electrode 165 and between the channel structure 140 and the gate electrode 165, and may be disposed to cover at least a portion of surfaces of the gate electrode 165. For example, the gate dielectric layer 162 may be disposed to surround all surfaces except the top surface of the gate electrode 165. The gate dielectric layer 162 may extend between the gate electrode 165 and the gate spacer layers 164, but an example embodiment thereof is not limited thereto. The gate dielectric layer 162 may include oxide, nitride, or a high-k dielectric material.

The gate electrode 165 may fill a gap between the channel layers 141, 142 and 143, on the upper portion of the active fin 105, and may extend to an upper portion of the channel structure 140. The gate electrode 165 may be spaced apart from the plurality of channel layers 141, 142 and 143 by the gate dielectric layer 162. The gate electrode 165 may include a conductive material, for example, a metal nitride such as titanium nitride (TiN), tantalum nitride (TaN), or tungsten nitride (WN), and/or metal such as aluminum (Al), tungsten (W), molybdenum (Mo) or the like, or a semiconductor material such as doped polysilicon. The gate electrode 165 may also include two or more layers. The gate electrode 165 may be divided by a separate separation portion between at least some adjacent transistors, depending on the configuration of the semiconductor device 100c.

The internal spacer layers 130 may be disposed in parallel with the gate electrode 165, between the channel structures 140. Below the third channel layer 143, a portion of the gate electrode 165 may be spaced apart from the source/drain regions 150 by a corresponding one of the internal spacer layers 130, to be electrically separated from each other. Each of the internal spacer layers 130 may have a curved side, spaced apart from the corresponding one of the gate electrodes 165. For example, the curved side of the internal spacer layer 130 may be convexly rounded toward the portion of the corresponding one of the gate electrodes 165, but an example embodiment thereof is not limited thereto. The internal spacer layers 130 may be formed of oxide, nitride, and oxynitride, and for example, may be formed of a low dielectric constant film. In some embodiments, the internal spacer layers 130 may be omitted, and in this case, the gate dielectric layer 162 and the gate electrode 165 may be extended in the X direction.

In the above, as an example of the semiconductor device according to the example embodiments, FinFET and MBCFET™ devices are illustrated, but example embodiments of the present inventive concept are not limited thereto. A semiconductor device according to some embodiments may include a tunneling field effect transistor (tunneling FET), a three-dimensional (3D) transistor, and the like.

Figure 6:
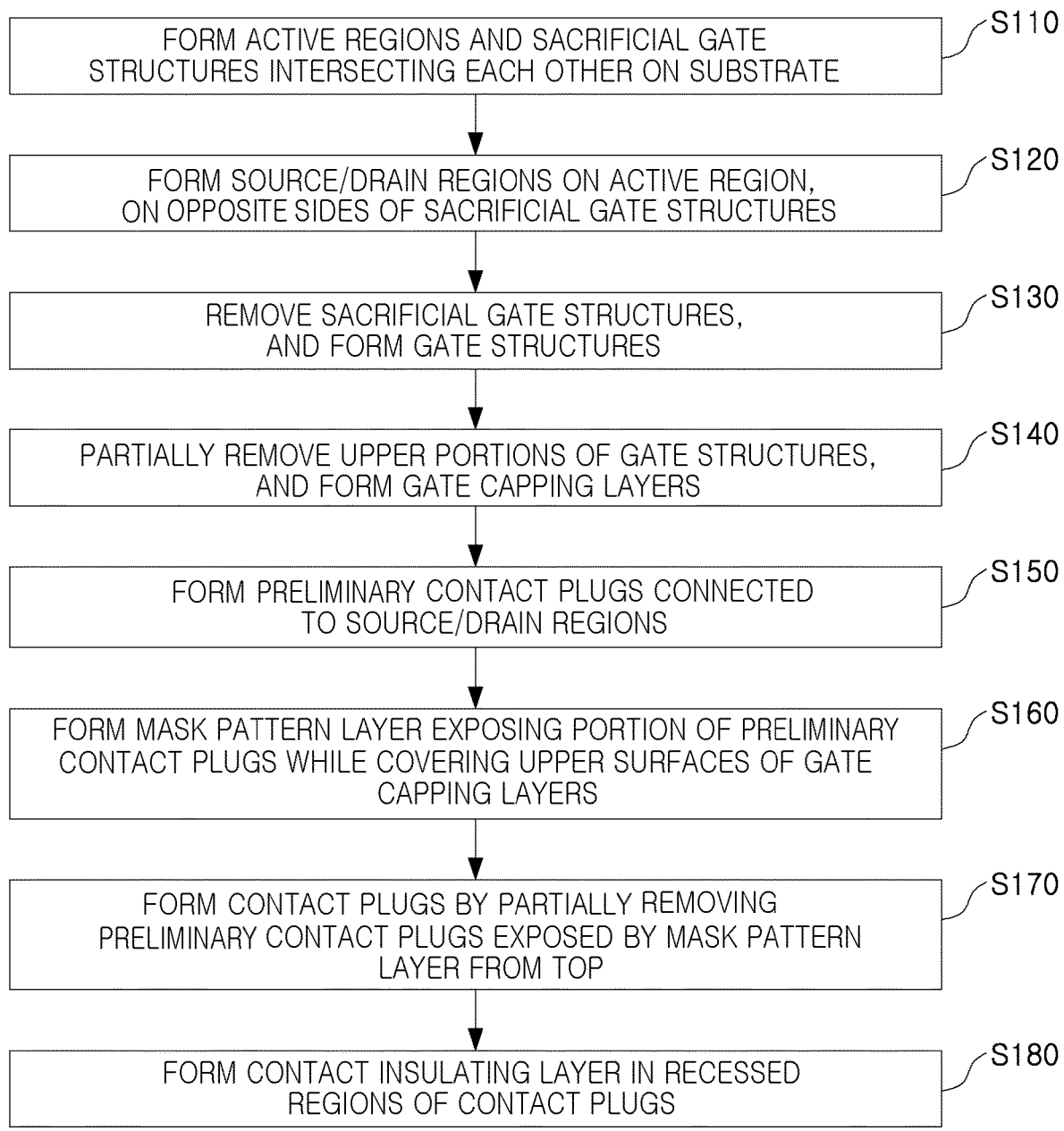
FIG. 6 is a flowchart illustrating a method of manufacturing a semiconductor device according to example embodiments.

FIG. 6 is a flowchart illustrating a method of manufacturing a semiconductor device according to example embodiments.

FIGS. 7 to 16 are diagrams illustrating a method of manufacturing a semiconductor device according to example embodiments. FIGS. 7 to 16 illustrate an embodiment of a method of manufacturing the semiconductor device of FIGS. 1 to 2B, and FIGS. 4A and 4B, and illustrate cross sections corresponding to the cross sections taken along lines I-I' and III-III' of FIG. 1.

Figure 7:
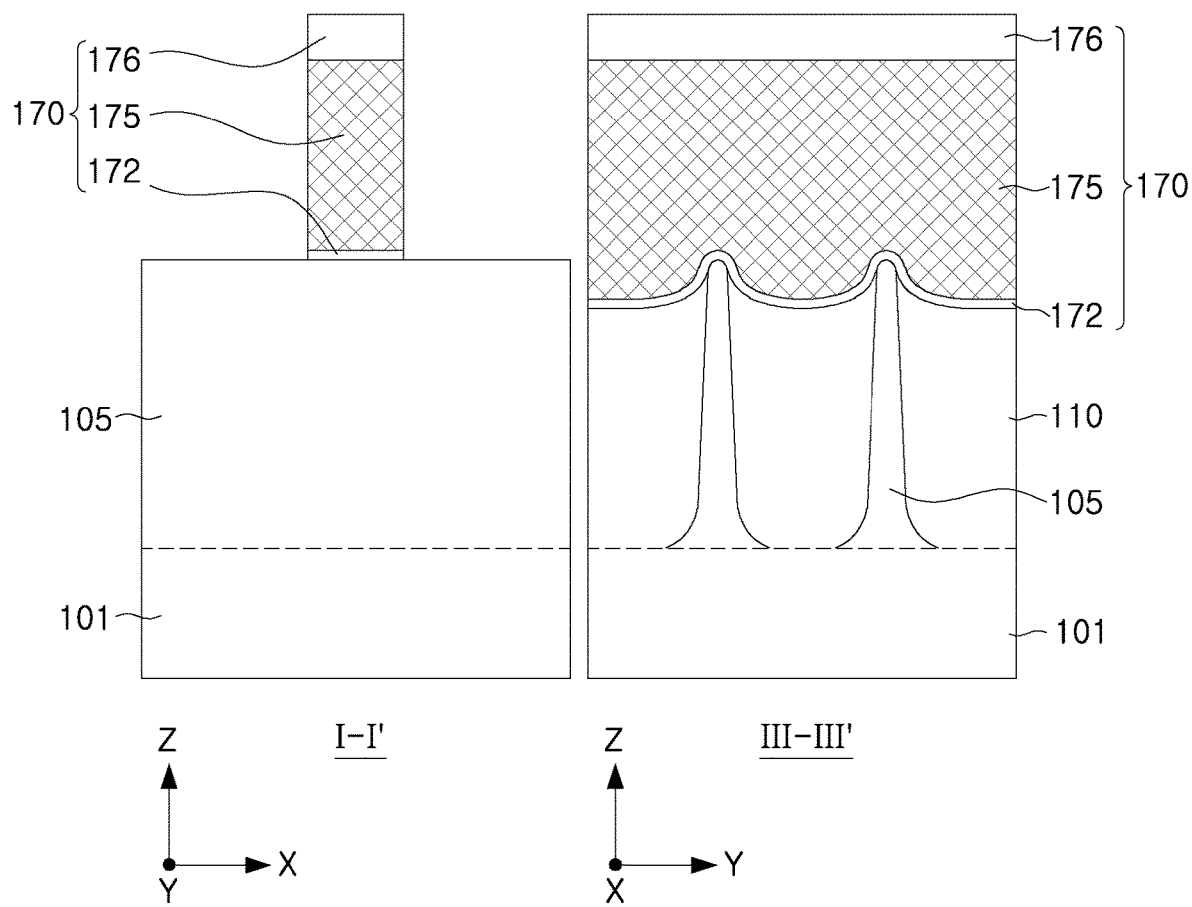
FIGS. 7 to 16 are diagrams illustrating processes of a method of manufacturing a semiconductor device according to example embodiments in process order.

Referring to FIGS. 6 and 7, after patterning a substrate 101 to define an active region including active fins 105 and forming a device isolation layer 110, sacrificial gate structures 170 may be formed (S110).

First, the active fins 105 may be formed, by anisotropically etching the substrate 101 using a mask layer to form trenches. Since the trench with a relatively high aspect ratio may have a downwardly decreasing width, each of the active fins 105 may have an upwardly decreasing width. The device isolation layer 110 may be formed by filling the trench with an insulating material layer and then planarizing the insulating material layer and the upper surfaces of the active fins 105. In the case of the semiconductor device 100c of FIG. 5, in this operation, the first to third channel layers 141, 142 and 143 of the channel structures 140, constituting the active region, may be stacked on the active fins 105. The first to third channel layers 141, 142 and 143 and sacrificial layers may be alternately and vertically stacked on each other.

Next, the sacrificial gate structures 170 may be formed on the active fins 105 to have a linear shape extending in a Y direction to intersect the active fins 105. The sacrificial gate structures 170 may be formed where the first and second gate dielectric layers 162 and 163 and the gate electrode 165 are to be formed as illustrated in FIG. 2A through a subsequent process. The sacrificial gate structure 170 may include first and second sacrificial gate layers 172 and 175 and a gate mask pattern layer 176. The first and second sacrificial gate layers 172 and 175 may be patterned using the gate mask pattern layer 176.

The first and second sacrificial gate layers 172 and 175 may be an insulating layer and a conductive layer, respectively, but are not limited thereto. For example, the first and second sacrificial gate layers 172 and 175 may be formed of a single layer. For example, the first sacrificial gate layer 172 may include silicon oxide, and the second sacrificial gate layer 175 may include polysilicon. The gate mask pattern layer 176 may include silicon oxide and/or silicon nitride. The structure of the sacrificial gate structure 170 may be variously changed in example embodiments.

Figure 8:
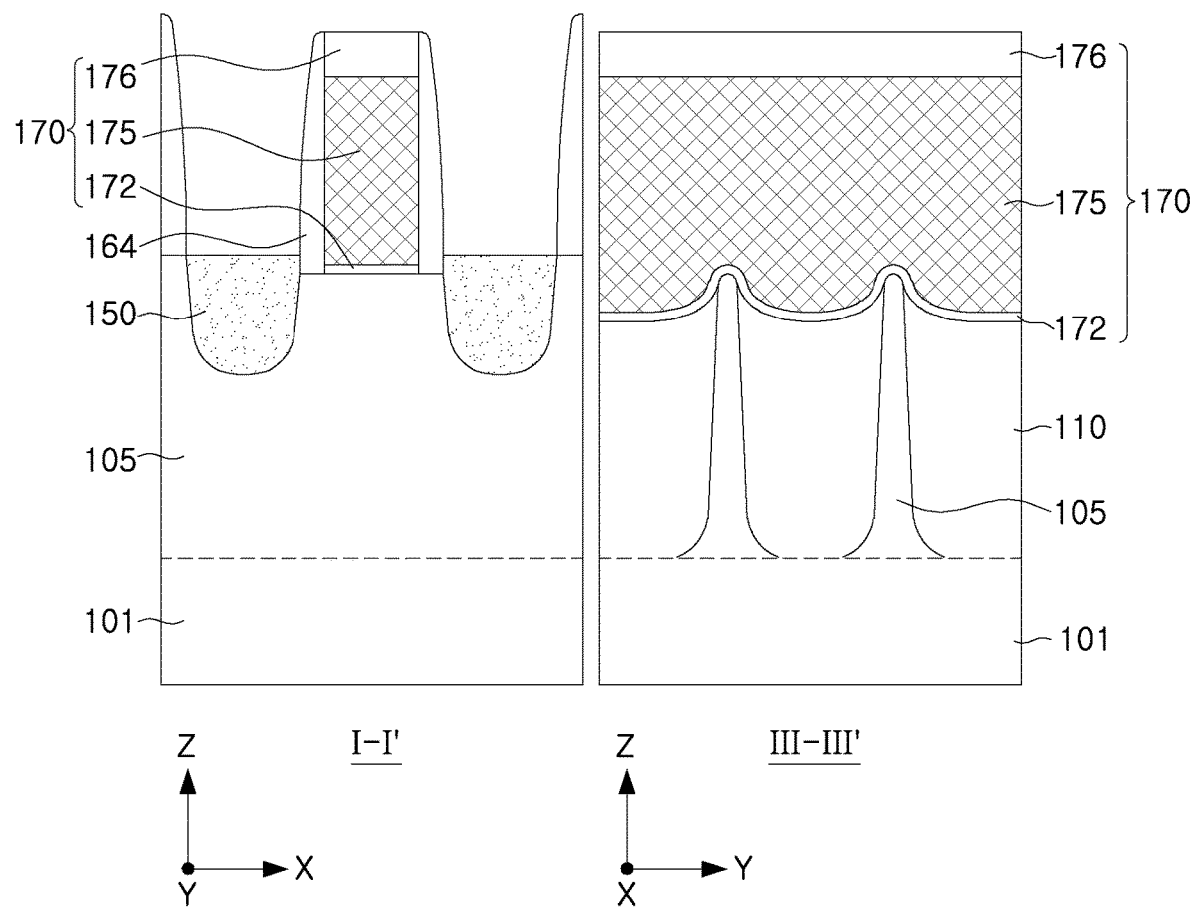

Referring to FIGS. 6 and 8, gate spacer layers 164 may be formed on opposite sidewalls of the sacrificial gate structures 170, and the active fins 105 exposed between the sacrificial gate structures 170 may be recessed and source/drain regions 150 may be formed (S120).

First, the gate spacer layers 164 may be formed on side surfaces of the sacrificial gate structures 170. The gate spacer layers 164 may be formed of a low dielectric constant material and may include, for example, at least one of SiO, SiN, SiCN, SiOC, SiON and SiOCN.

Next, the active fins 105 may be recessed from a top surface to a predetermined depth to form a recessed region. The recess process may be performed by sequentially applying a dry etching process and a wet etching process, for example. Accordingly, in this operation, the active fins 105 may have a lower height outside the sacrificial gate structures 170 than in a lower portion of the sacrificial gate structures 170. In some embodiments, the recessed region may have a shape extending to lower portions of the gate spacer layers 164 or the sacrificial gate structures 170. Selectively, after the recess process is performed, a process of curing the surface of the recessed active fins 105 may be performed through an additional process.

Next, the source/drain regions 150 may be formed by growing from the active fins 105 using, for example, a selective epitaxial growth (SEG) process. The source/drain regions 150 may include impurities by in-situ doping.

Figure 9:
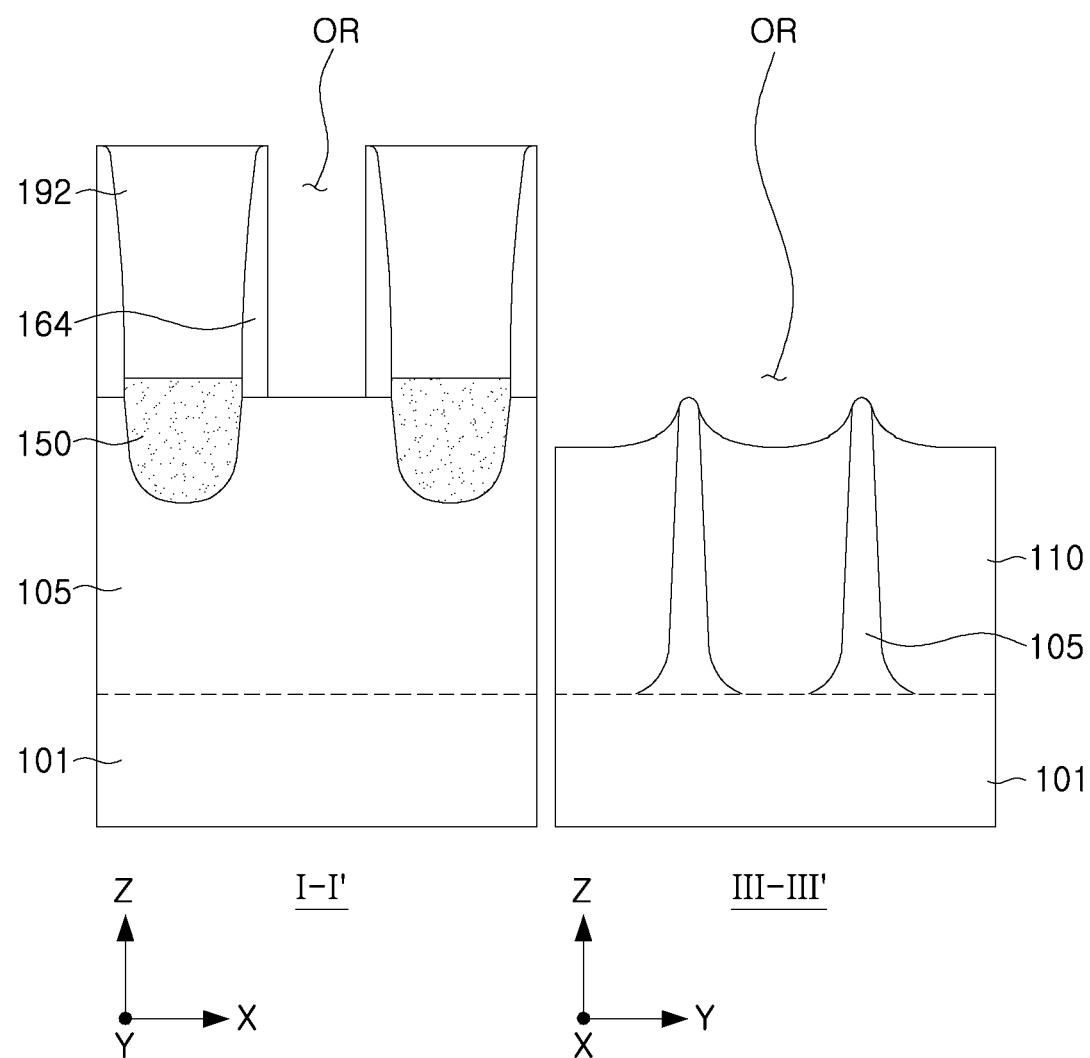
Figure 10:
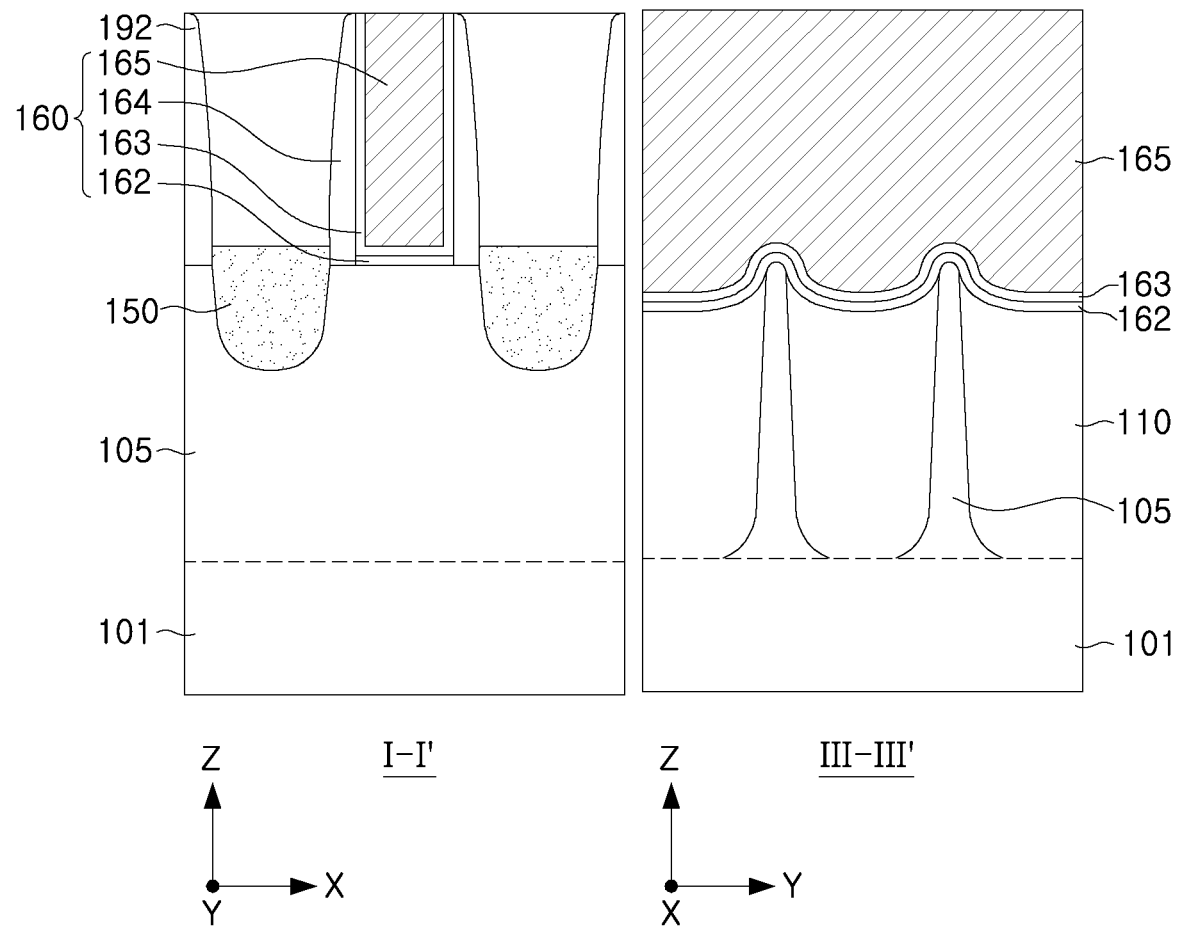

Referring to FIGS. 6, 9 and 10, after forming a first interlayer insulating layer 192 on the source/drain regions 150, the sacrificial gate structures 170 are removed, and first and second gate dielectric layers 162 and 163 and a gate electrode 165 may be formed in openings OR, thereby forming gate structures 160 (S130).

First, as illustrated in FIG. 9, the first interlayer insulating layer 192 may be formed, by depositing an insulating material to cover the source/drain regions 150, the sacrificial gate structures 170, and the gate spacer layers 164 and then performing a planarization process to expose the top surfaces of the second sacrificial gate layers 175 or the gate mask pattern layers 176. According to example embodiments, in the planarization process, the gate mask pattern layer 176 may be removed. The first interlayer insulating layer 192 may include, for example, at least one of oxide, nitride, and oxynitride. In an example embodiment, the first interlayer insulating layer 192 may include a low dielectric constant material.

Next, the remaining sacrificial gate structures 170 including the first and second sacrificial gate layers 172 and 175 may be selectively removed with respect to lower active fins 105 and the device isolation layer 110, thereby forming the openings OR. The removal process of the sacrificial gate structures 170 may use at least one of a dry etching process and a wet etching process.

Next, as illustrated in FIG. 10, the first and second gate dielectric layers 162 and 163 may be substantially conformally formed along sidewalls and bottom surfaces of the openings OR. The first and second gate dielectric layers 162 and 163 may each include oxide, nitride, or a high-k dielectric material. The gate electrode 165 may be formed to fill the openings OR inside the first and second gate dielectric layers 162 and 163. The gate electrode 165 may include metal or a semiconductor material.

After forming the first and second gate dielectric layers 162 and 163 and the gate electrode 165, those layers remaining on an upper surface of the first interlayer insulating layer 192 may be removed using a planarization process, such as a chemical mechanical polishing (CMP) process.

Figure 11:
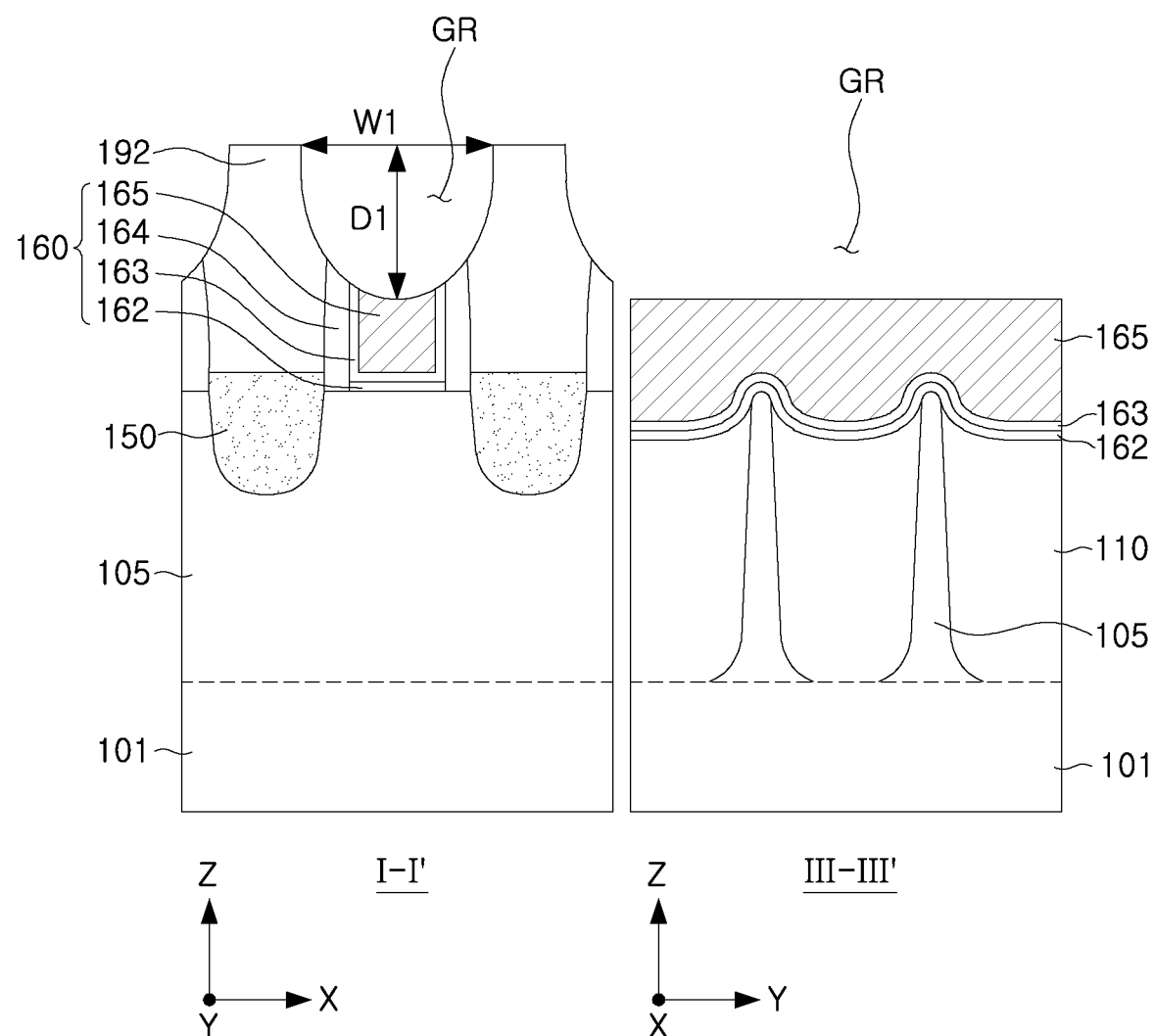
Figure 12:
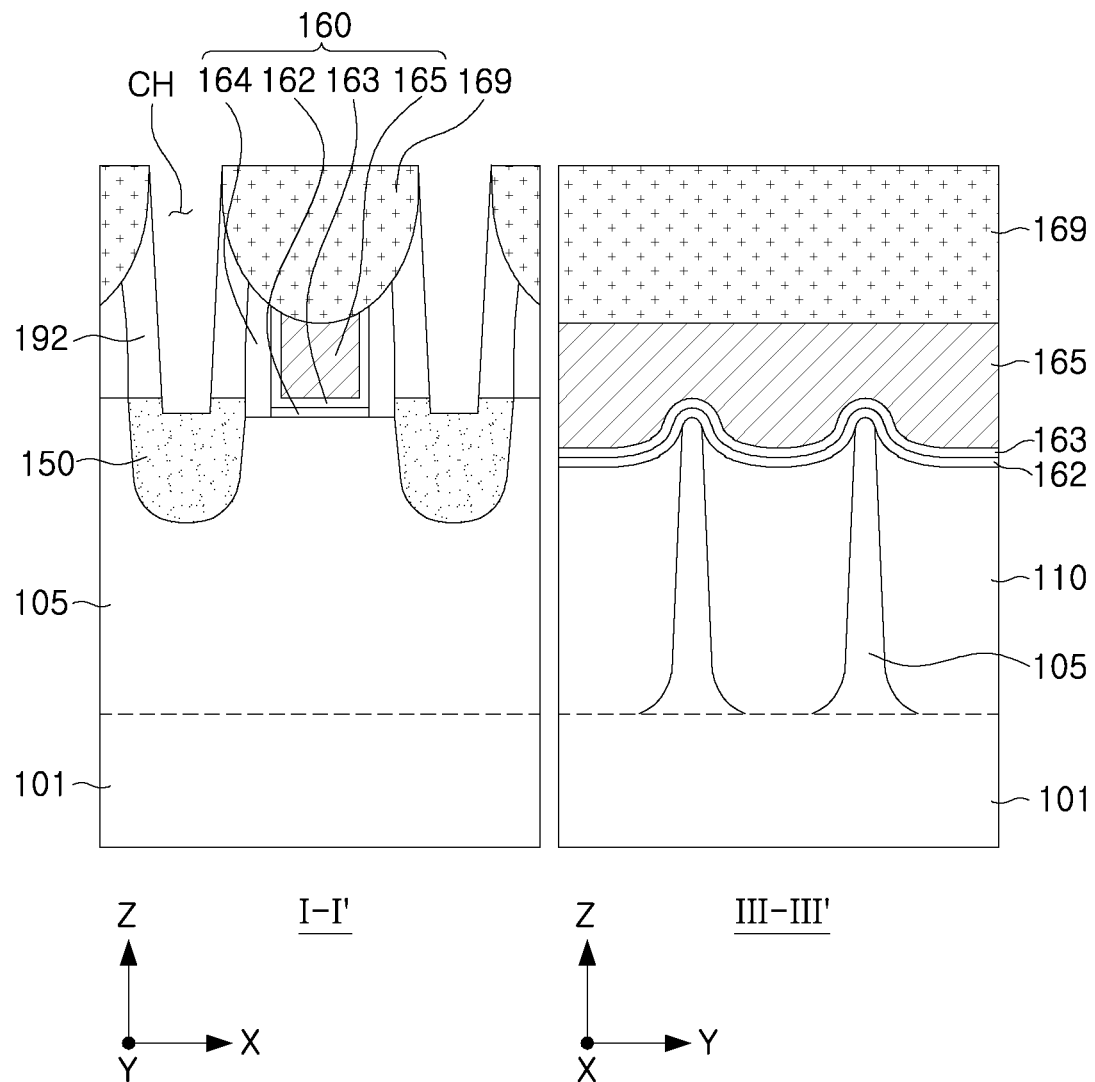

Referring to FIGS. 6, 11 and 12, gate recess regions GR may be formed by partially removing the gate structures 160 from the top, gate capping layers 169 may be formed to fill the gate recess regions GR, and contact holes CH may be formed (S140).

First, as illustrated in FIG. 11, the gate recess regions GR may be formed by a dry etching process and/or a wet etching process. A width W1 of the gate recess regions GR may be greater than a width of the gate structure 160, but is not limited thereto. A depth D1 of the gate recess regions GR may be variously changed in example embodiments. Lower surfaces of the gate recess regions GR may be convex downwardly, but an example embodiment thereof is not limited thereto. For example, the lower surfaces of the gate recess regions GR may have a flat shape.

Next, as illustrated in FIG. 12, the gate capping layers 169 may be formed through a deposition process and a planarization process. The contact holes CH may be formed by removing the first interlayer insulating layer 192 from the top. The gate capping layers 169 may serve to allow the contact holes CH to be self-aligned when the contact holes CH are formed. To this end, the gate capping layers 169 may be formed of a material different from that of the first interlayer insulating layer 192. When the contact holes CH are formed, the first interlayer insulating layer 192 may be selectively removed with respect to the gate capping layers 169.

Figure 13:
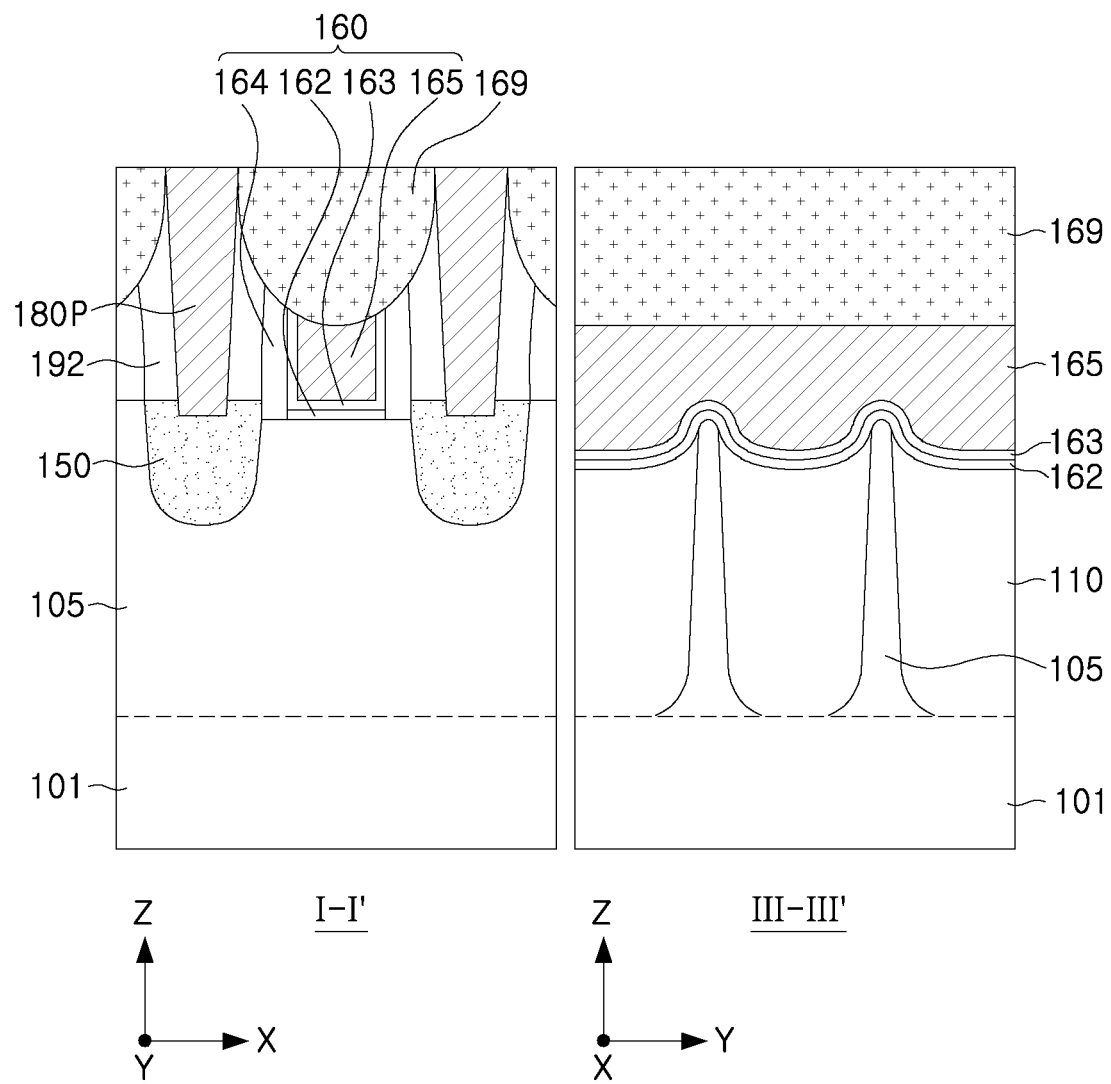

Referring to FIGS. 6 and 13, preliminary contact plugs 180P may be formed by filling the contact holes CH with a conductive material (S150).

Preliminary contact plugs 180P may be formed through a deposition process and a planarization process. The preliminary contact plugs 180P may be formed by completely filling the contact holes CH with a conductive material, and then, removing the conductive material remaining on the gate capping layers 169 using a planarization process.

Referring to FIGS. 6 and 14A to 14C, a mask pattern layer MA for performing a process of removing a portion of the preliminary contact plugs 180P may be formed (S160).

Figure 14A:
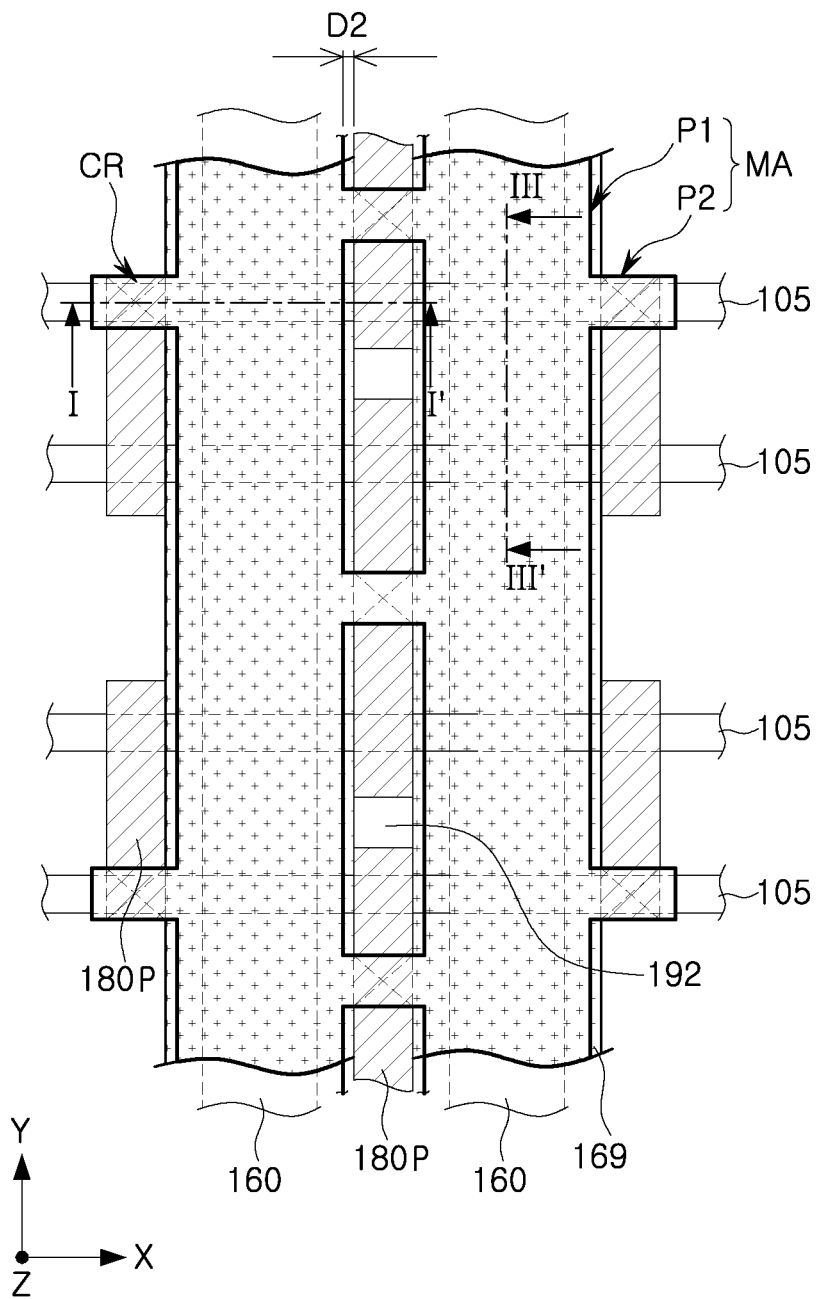
Figure 14B:
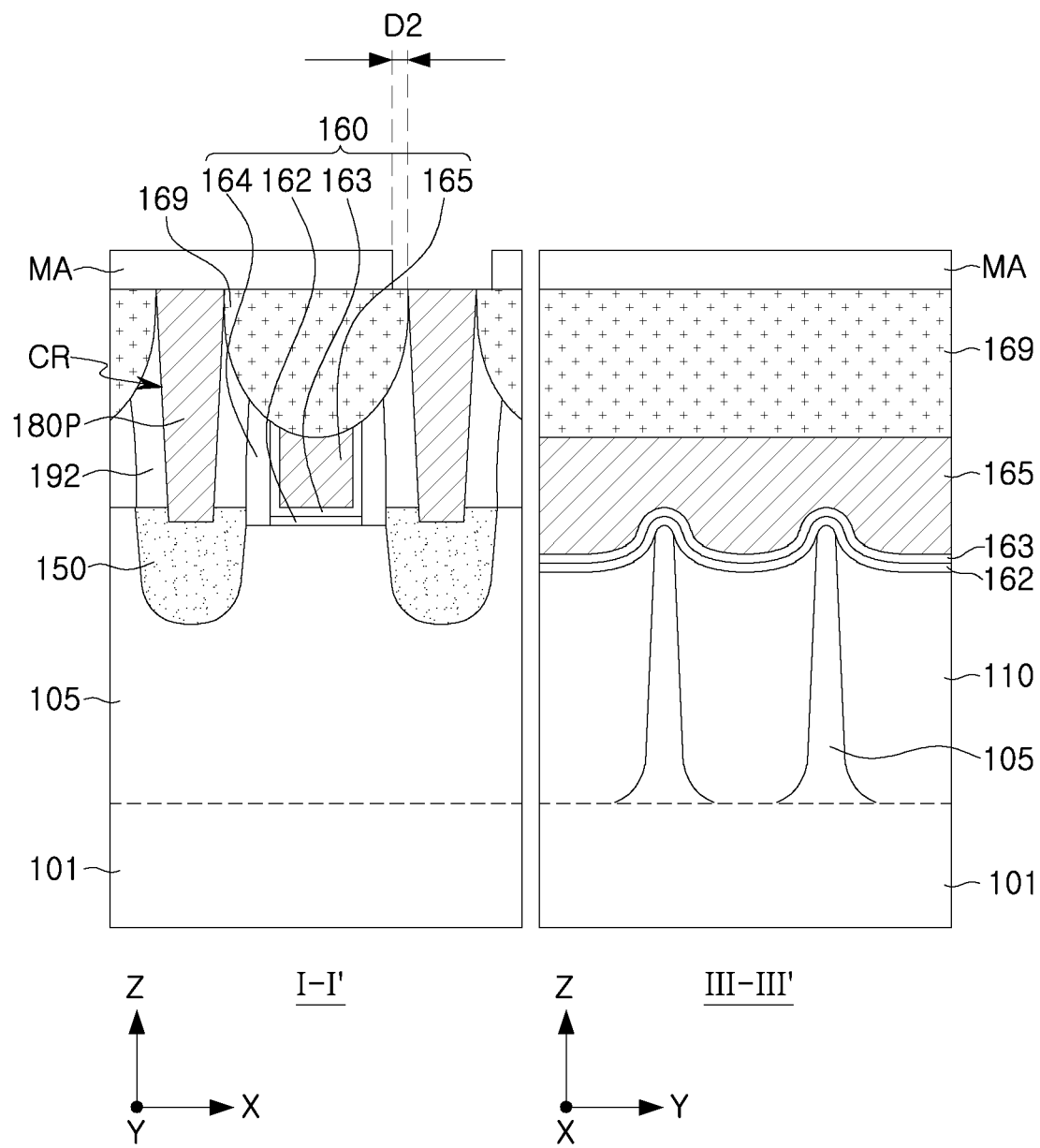
Figure 14C:
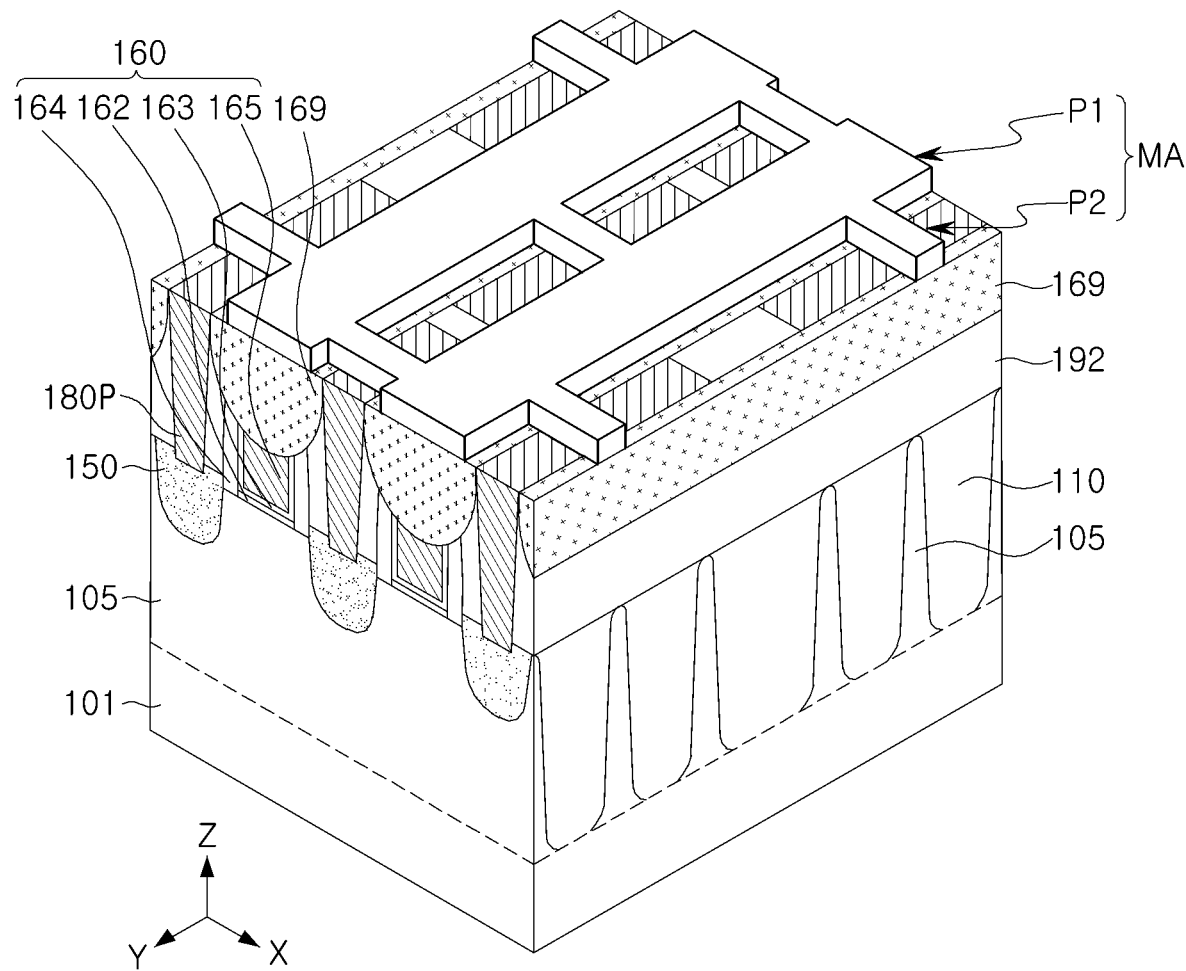

The mask pattern layer MA may be formed to cover regions of the preliminary contact plugs 180P in which contact regions CR are to be formed, exposing the other region of the preliminary contact plugs 180P. The mask pattern layer MA may also expose the first interlayer insulating layer 192 between the preliminary contact plugs 180P. For example, the mask pattern layer MA may be formed to completely cover the entire upper surface of the gate capping layers 169 on the gate structures 160 or to expose opposite edges, in the X direction, of each of the gate capping layers 169 as illustrated in FIGS. 14A to 14C or an edge of each of the gate capping layers 169. The mask pattern layer MA may include a photoresist layer, and in some embodiments, may also include a hard mask layer and a photoresist layer.

The mask pattern layer MA may include first pattern layers P1 disposed on the gate capping layers 169 and extending in the Y direction along the gate capping layers 169, and second pattern layers P2 disposed on the preliminary contact plugs 180P to connect the first pattern layers P1 to each other and extending in the X direction. End portions of the first pattern layers P1 in the X direction may be spaced apart inwardly from edges of the gate capping layers 169 by a predetermined length D2, to partially expose the gate capping layers 169. The length D2 may be determined in a range capable of securing a process margin in a photolithography process. A minimum width of the second pattern layers P2 in the Y direction may be, for example, in a range of about 10 nm to about 40 nm.

The mask pattern layer MA may have a mesh shape in which the first pattern layers P1 and the second pattern layers P2 are connected. By the mask pattern layer MA, a contact area between the mask pattern layer MA and the lower structure may increase. Therefore, in this case, as compared with the case of forming a mask layer in an island pattern covering only the regions corresponding to the contact regions CR, a defect caused by lifting of the mask pattern layer MA may be prevented. In addition, since the mask pattern layer MA includes the first pattern layers P1, the gate capping layers 169 may be prevented from being lost during a subsequent removal process of the preliminary contact plugs 180P. Meanwhile, if a mask layer is used with the island pattern, since a contact insulating layer 194 is filled in an area in which the gate capping layers 169 are lost, poor connection between the gate contact plug 185 (see FIG. 2B) and the gate electrode 165 may occur. However, in the example embodiment of the present inventive concept, since the gate capping layers 169 are protected by the mask pattern layer MA with a mesh shape, such connection failure may be prevented.

Figure 15:
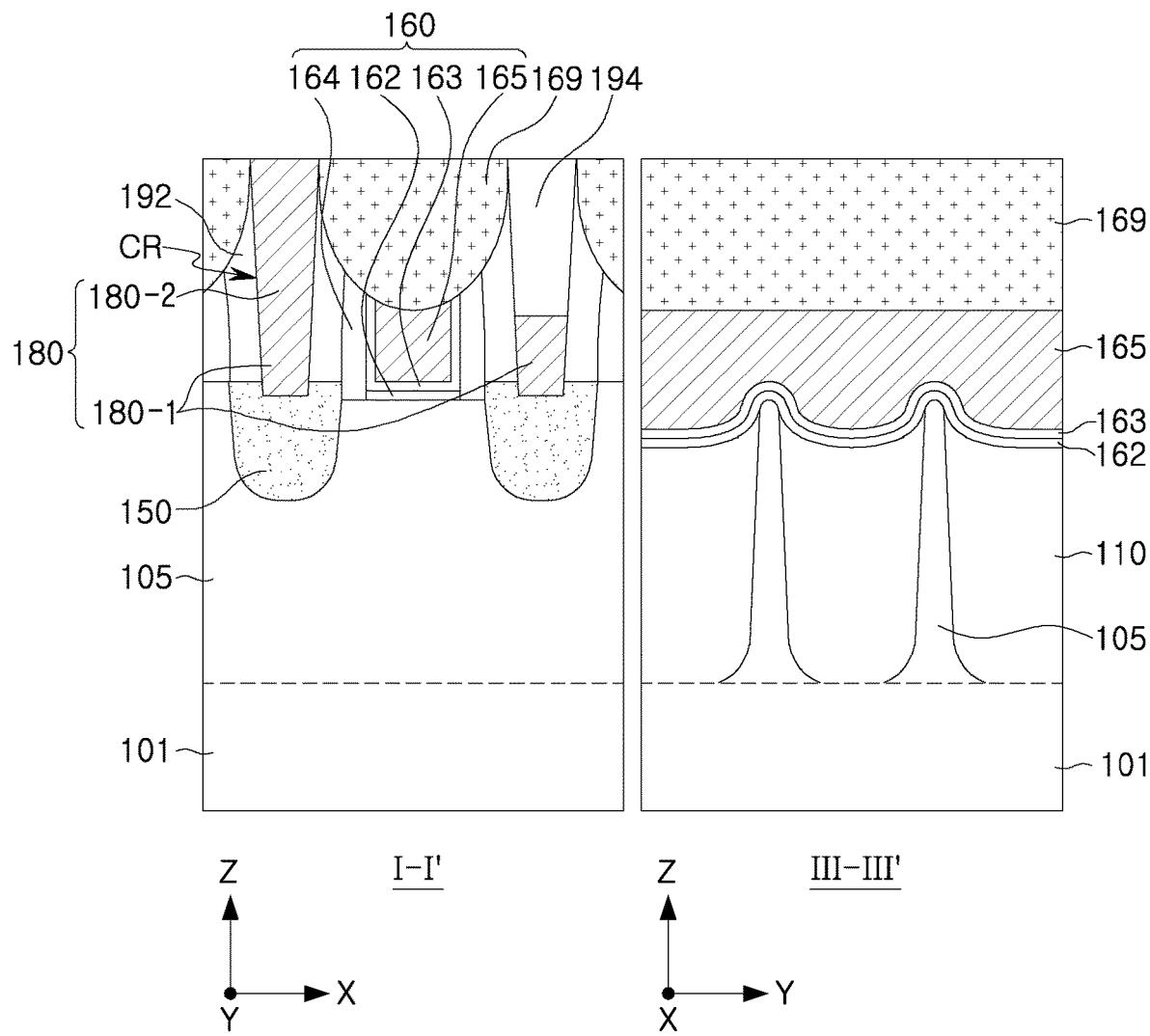

Referring to FIGS. 6 and 15, contact plugs 180 having recessed regions may be formed by partially removing exposed preliminary contact plugs 180P by the mask pattern layer MA from the top (S170), and the contact insulating layer 194 may be formed (S180).

First, the preliminary contact plugs 180P may be partially removed to a predetermined depth by a dry etching process and/or a wet etching process so that only the contact region CR may protrude upward. As to a detailed shape of the contact plugs 180, the descriptions with reference to FIGS. 1 to 3B may be equally applied.

The preliminary contact plugs 180P may be selectively removed with respect to gate capping layers 169 and the first interlayer insulating layer 192. However, even in this case, at least a portion of the first interlayer insulating layer 192 and the gate capping layers 169 exposed from the mask pattern layer MA may be removed together. Therefore, as illustrated in FIGS. 14A to 14C, in the case in which the edges of the gate capping layers 169 are exposed by the length D2, the recessed edge 169E of each of the gate capping layers 169a and 169b as illustrated in FIGS. 4A and 4B may be formed depending on the arrangement of the mask pattern layer MA.

Next, the contact insulating layer 194 may be formed by depositing an insulating material so that the contact insulating layer 194 fills the recessed region of the contact plugs 180, and by removing the insulating material remaining on the upper portion using a planarization process such as a CMP process. When the gate capping layers 169a and 169b have the recessed edge 169E as illustrated in FIGS. 4A and 4B, the insulating material forming the contact insulating layer 194 may be formed to fill the recessed region of the edge 169E. By the planarization process, the top surfaces of the contact plugs 180, the gate capping layers 169 and the contact insulating layer 194 may be substantially coplanar.

According to example embodiments, even when the edges of the gate capping layers 169 are partially removed as described above, the gate capping layers 169 may be planarized together in this planarization process, to finally obtain the structure as illustrated in FIG. 2A. For example, the gate capping layers 169 may have a flat structure after the removal of a portion of the preliminary contact plugs 180P or may have an edge partially removed depending on the position of the end portion of the mask pattern layer MA. In the case of having the edge partially removed, the gate capping layers 169 may have an ultimate structure in which the recessed edge 169E is provided as illustrated in FIGS. 4A and 4B, or may have a flat top surface as illustrated in FIG. 2A by the planarization process.

Although not illustrated in the drawings, a process of forming the gate contact plug 185 (see FIG. 2A) may be further performed. The gate contact plug 185 may be formed by forming a contact hole penetrating through the gate capping layers 169 and connected to the gate structures 160 and then by depositing a conductive material, on top of the active fin 105. According to example embodiments, the gate contact plugs 185 may be formed in a separate process, or may be formed together when the preliminary contact plugs 180P described above with reference to FIG. 13 are formed.

Figure 16:
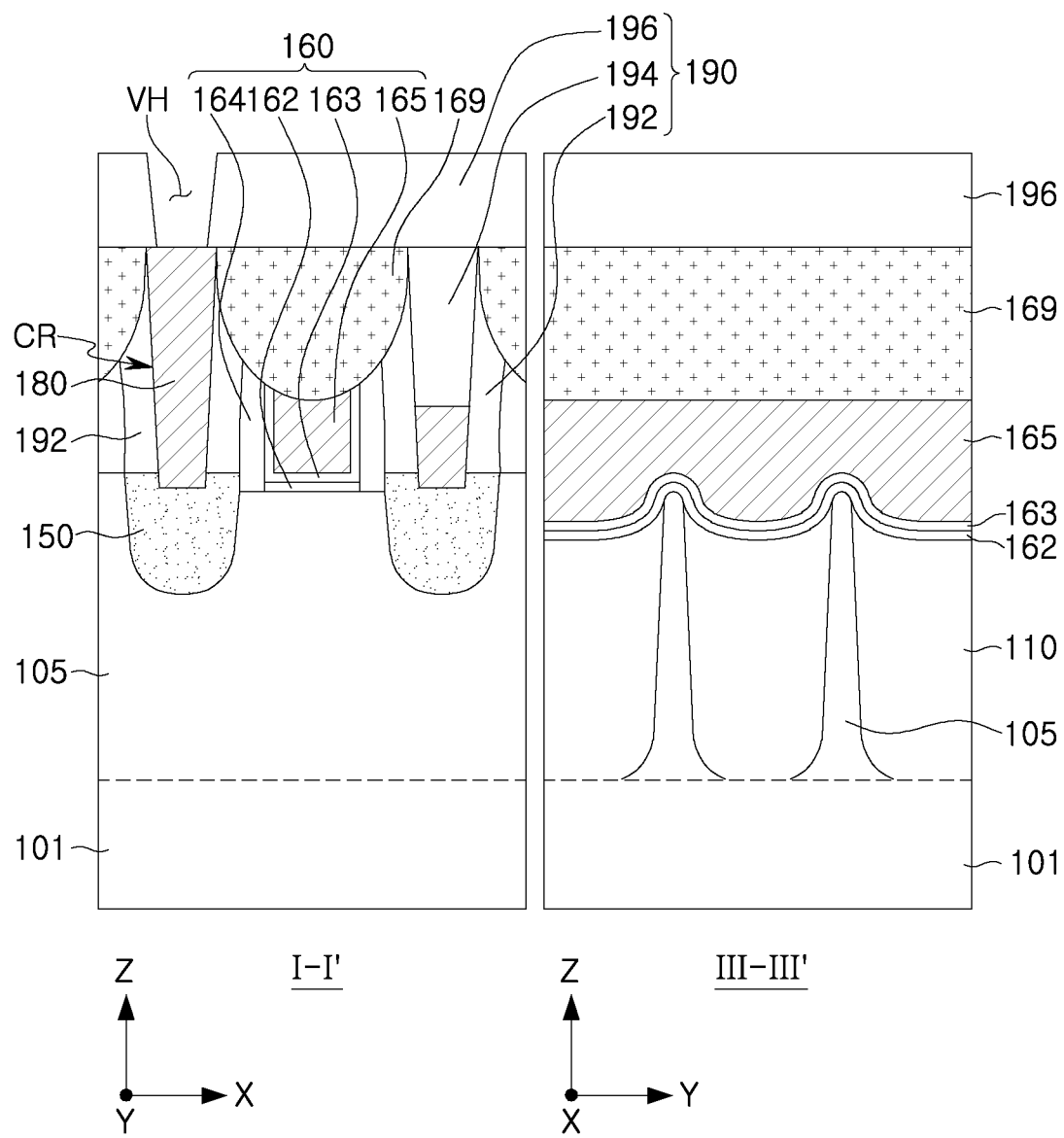

Referring to FIGS. 6 and 16, a second interlayer insulating layer 196 may be formed on the gate capping layers 169, the first interlayer insulating layer 192, and the contact insulating layer 194, and via holes VH may be formed in the second interlayer insulating layer 196.

The via holes VH may be formed, by partially removing the second interlayer insulating layer 196 using a separate mask layer to form first and second vias 187 and 189 (see FIG. 2A). Contact regions CR of the contact plugs 180 may be exposed to lower portions of the via holes VH.

Next, referring to FIGS. 2A and 2B, the first and second vias 187 and 189 may be formed by filling the via holes VH with a conductive material.

As set forth above, according to example embodiments, by using a mask pattern layer with a mesh shape in a recess process for a contact plug, a method of manufacturing a semiconductor device having increased reliability with increased productivity, and a semiconductor device manufactured thereby, may be provided.

While example embodiments have been illustrated and described above, it will be apparent to those skilled in the art that modifications and variations could be made without departing from the scope of the present inventive concept as defined by the appended claims.

What is claimed is:

1. A semiconductor device, comprising:
   an active region extending in a first direction on a substrate;
   a gate electrode extending in a second direction to intersect the active region;
   channel layers spaced apart from each other in a third direction, perpendicular to an upper surface of the substrate, on the active region and surrounded by the gate electrode;
   source/drain regions on both sides of the gate electrode and connected to the channel layers;
   an interlayer insulating layer covering the source/drain regions;
   a contact plug penetrating through the interlayer insulating layer and connected to each of the source/drain regions,
   wherein the contact plug includes a first portion extending in the second direction, and a second portion protruding upwardly from an end of the first portion and defining a recess region of the contact plug, and
   wherein a first length of the second portion in the second direction is less than a second length of the recess region in the second direction; and
   a contact insulating layer filling the recess region of the contact plug.

2. The semiconductor device of claim 1,
   wherein opposite side surfaces, in the second direction, of the second portion have negative slopes at first and second obtuse angles with respect to an upper surface of the first portion, respectively.

3. The semiconductor device of claim 2,
   wherein the first and second obtuse angles are substantially a same.

4. The semiconductor device of claim 1,
   wherein a third length, in the first direction, of an upper surface of the second portion in the first direction is greater than a fourth length, in the first direction, of a lower surface of the first portion.

5. The semiconductor device of claim 1, further comprising:
   a gate capping layer on the gate electrode and having a recessed edge in a shape recessed from an upper surface of the gate capping layer.

6. The semiconductor device of claim 5,
   wherein the recessed edge of the gate capping layer is adjacent to the recess region of the contact plug in the first direction.

7. The semiconductor device of claim 5, wherein an edge of the gate capping layer, which is not recessed, contacts the second portion of the contact plug.

8. The semiconductor device of claim 5,
   wherein the contact insulating layer further fills the recessed edge of the gate capping layer.

9. The semiconductor device of claim 5,
   wherein the gate capping layer has a lower curved surface that is convex downwardly.

10. A semiconductor device, comprising:
    an active region extending in a first direction on a substrate;
    a gate electrode extending in a second direction to intersect the active region;
    channel layers spaced apart from each other in a third direction, perpendicular to an upper surface of the substrate, on the active region and surrounded by the gate electrode;
    source/drain regions on both sides of the gate electrode and connected to the channel layers;
    a contact plug connected to each of the source/drain regions on each of the source/drain regions; and
    a gate capping layer on the gate electrode and having a width greater than a width of the gate electrode,
    wherein the contact plug includes a first portion extending in the second direction, and a second portion protruding upwardly from a portion of the first portion and defining at least one recess region of the contact plug, and
    wherein a length of an upper surface of the second portion in the first direction is greater than a length of a lower surface of the first portion in the first direction.

11. The semiconductor device of claim 10, wherein a length of the second portion in the second direction is less than a second length of the at least one recess region in the second direction.

12. The semiconductor device of claim 10, wherein the second portion is spaced apart from both ends of the first portion in the second direction.

13. The semiconductor device of claim 12, wherein the at least one recess region includes first and second recessed regions on both sides of the second portion in the second direction.

14. The semiconductor device of claim 12, wherein a first side surface of the second portion in the second direction has a positive slope, and a second side surface of the second portion opposing the first side surface has a negative slope.

15. A semiconductor device, comprising:
- an active region extending in a first direction on a substrate;
- a gate electrode extending in a second direction to intersect the active region;
- source/drain regions on both sides of the gate electrode;
- a contact plug connected to each of the source/drain regions;
- a gate capping layer on the gate electrode and having a recessed edge in a shape recessed from an upper surface; and
- a contact insulating layer filling the recessed edge of the gate capping layer, wherein the contact plug includes a first portion extending in the second direction, and a second portion protruding upwardly from a portion of the first portion and defining at least one recess region of the contact plug, and wherein the contact insulating layer fills the at least one recess region of the contact plug.

16. The semiconductor device of claim 15, wherein a first length of the second portion in the second direction is less than a second length of the recess region in the second direction.

17. The semiconductor device of claim 15, wherein a third length of an upper surface of the second portion in the first direction is greater than a fourth length of a lower surface of the first portion in the first direction.

18. The semiconductor device of claim 15, wherein the recessed edge of the gate capping layer is in adjacent to the recess region of the contact plug in the first direction.

19. The semiconductor device of claim 15, wherein an edge of the gate capping layer, which is not recessed, is contact with the second portion of the contact plug.

* * * * *